United States Patent
Tiwari

(10) Patent No.: US 9,589,602 B2
(45) Date of Patent: *Mar. 7, 2017

(54) COMPARISON OPERATIONS IN MEMORY

(71) Applicant: Micron Technology, Inc., Boise, ID (US)

(72) Inventor: Sanjay Tiwari, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/836,726

(22) Filed: Aug. 26, 2015

(65) Prior Publication Data
US 2016/0064047 A1  Mar. 3, 2016

Related U.S. Application Data

(60) Provisional application No. 62/045,178, filed on Sep. 3, 2014.

(51) Int. Cl.
*G11C 7/10* (2006.01)
*G11C 7/06* (2006.01)

(52) U.S. Cl.
CPC .............. *G11C 7/065* (2013.01); *G11C 7/106* (2013.01); *G11C 7/1006* (2013.01)

(58) Field of Classification Search
CPC ........ G11C 7/065; G11C 7/1006; G11C 7/106
USPC ..................... 365/189.05, 49.1, 49.11, 49.17
See application file for complete search history.

(56) References Cited

U.S. PATENT DOCUMENTS

| 4,380,046 A | 4/1983 | Fung |
| 4,435,792 A | 3/1984 | Bechtolsheim |
| 4,435,793 A | 3/1984 | Ochii |
| 4,727,474 A | 2/1988 | Batcher |
| 4,843,264 A | 6/1989 | Galbraith |

(Continued)

FOREIGN PATENT DOCUMENTS

| CN | 102141905 | 8/2011 |
| EP | 0214718 | 3/1987 |

(Continued)

OTHER PUBLICATIONS

International Search Report and Written Opinion for related PCT Application No. PCT/US2015/048248, dated Dec. 15, 2015, 13 pages.

(Continued)

*Primary Examiner* — Fernando Hidalgo
(74) *Attorney, Agent, or Firm* — Brooks, Cameron & Huebsch, PLLC

(57) ABSTRACT

The present disclosure includes apparatuses and methods related to performing comparison operations in memory. An example apparatus can include a first group of memory cells coupled to a first access line and configured to store a plurality of first elements, and a second group of memory cells coupled to a second access line and configured to store a plurality of second elements. The apparatus can include a controller configured to cause the plurality of first elements to be compared with the plurality of second elements by controlling sensing circuitry to perform a number of operations without transferring data via an input/output (I/O) line, and the plurality of first elements and the plurality of second elements can be compared in parallel.

24 Claims, 13 Drawing Sheets

(56) References Cited

U.S. PATENT DOCUMENTS

| | | |
|---|---|---|
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,430,687 A | 7/1995 | Hung et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,953,738 A | 9/1999 | Rao |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,058,880 B1 | 6/2006 | Ding et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,532,529 B2 | 5/2009 | Dadashev et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,683,183 B2 | 3/2014 | Sprangle |
| 8,873,272 B2 | 10/2014 | Lee |
| 8,964,496 B2 | 2/2015 | Manning |

(56) References Cited

U.S. PATENT DOCUMENTS

| | | | |
|---|---|---|---|
| 8,971,124 B1 | 3/2015 | Manning | |
| 9,015,390 B2 | 4/2015 | Klein | |
| 9,047,193 B2 | 6/2015 | Lin et al. | |
| 9,165,023 B2 | 10/2015 | Moskovich et al. | |
| 9,235,414 B2 | 1/2016 | Gopal et al. | |
| 2001/0007112 A1 | 7/2001 | Porterfield | |
| 2001/0008492 A1 | 7/2001 | Higashiho | |
| 2001/0010057 A1 | 7/2001 | Yamada | |
| 2001/0028584 A1 | 10/2001 | Nakayama et al. | |
| 2001/0043089 A1 | 11/2001 | Forbes et al. | |
| 2002/0059355 A1 | 5/2002 | Peleg et al. | |
| 2003/0167426 A1 | 9/2003 | Slobodnik | |
| 2003/0196030 A1 | 10/2003 | Elliott et al. | |
| 2003/0222879 A1 | 12/2003 | Lin et al. | |
| 2004/0073592 A1 | 4/2004 | Kim et al. | |
| 2004/0073773 A1 | 4/2004 | Demjanenko | |
| 2004/0085840 A1 | 5/2004 | Vali et al. | |
| 2004/0095826 A1 | 5/2004 | Perner | |
| 2004/0154002 A1 | 8/2004 | Ball et al. | |
| 2004/0205289 A1 | 10/2004 | Srinivasan | |
| 2004/0240251 A1 | 12/2004 | Nozawa et al. | |
| 2005/0015557 A1 | 1/2005 | Wang et al. | |
| 2005/0078514 A1 | 4/2005 | Scheuerlein et al. | |
| 2005/0097417 A1 | 5/2005 | Agrawal et al. | |
| 2006/0047937 A1 | 3/2006 | Selvaggi et al. | |
| 2006/0069849 A1 | 3/2006 | Rudelic | |
| 2006/0146623 A1 | 7/2006 | Mizuno et al. | |
| 2006/0149804 A1 | 7/2006 | Luick et al. | |
| 2006/0181917 A1 | 8/2006 | Kang et al. | |
| 2006/0215432 A1 | 9/2006 | Wickeraad et al. | |
| 2006/0225072 A1 | 10/2006 | Lari et al. | |
| 2006/0291282 A1 | 12/2006 | Liu et al. | |
| 2007/0103986 A1 | 5/2007 | Chen | |
| 2007/0171747 A1 | 7/2007 | Hunter et al. | |
| 2007/0180006 A1 | 8/2007 | Gyoten et al. | |
| 2007/0180184 A1 | 8/2007 | Sakashita et al. | |
| 2007/0195602 A1 | 8/2007 | Fong et al. | |
| 2007/0285131 A1 | 12/2007 | Sohn | |
| 2007/0285979 A1 | 12/2007 | Turner | |
| 2007/0291532 A1 | 12/2007 | Tsuji | |
| 2008/0025073 A1 | 1/2008 | Arsovski | |
| 2008/0037333 A1 | 2/2008 | Kim et al. | |
| 2008/0052711 A1 | 2/2008 | Forin et al. | |
| 2008/0137388 A1 | 6/2008 | Krishnan et al. | |
| 2008/0165601 A1 | 7/2008 | Matick et al. | |
| 2008/0178053 A1 | 7/2008 | Gorman et al. | |
| 2008/0215937 A1 | 9/2008 | Dreibelbis et al. | |
| 2009/0067218 A1 | 3/2009 | Graber | |
| 2009/0154238 A1 | 6/2009 | Lee | |
| 2009/0154273 A1 | 6/2009 | Borot et al. | |
| 2009/0254697 A1* | 10/2009 | Akerib | G11C 7/1006 711/105 |
| 2010/0067296 A1 | 3/2010 | Li | |
| 2010/0091582 A1 | 4/2010 | Vali et al. | |
| 2010/0172190 A1 | 7/2010 | Lavi et al. | |
| 2010/0210076 A1 | 8/2010 | Gruber et al. | |
| 2010/0226183 A1 | 9/2010 | Kim | |
| 2010/0308858 A1 | 12/2010 | Noda et al. | |
| 2010/0332895 A1 | 12/2010 | Billing et al. | |
| 2011/0051523 A1 | 3/2011 | Manabe et al. | |
| 2011/0063919 A1 | 3/2011 | Chandrasekhar et al. | |
| 2011/0093662 A1 | 4/2011 | Walker et al. | |
| 2011/0103151 A1 | 5/2011 | Kim et al. | |
| 2011/0119467 A1 | 5/2011 | Cadambi et al. | |
| 2011/0122695 A1 | 5/2011 | Li et al. | |
| 2011/0140741 A1 | 6/2011 | Zerbe et al. | |
| 2011/0142419 A1* | 6/2011 | Zou | G06T 1/0035 386/260 |
| 2011/0219260 A1 | 9/2011 | Nobunaga et al. | |
| 2011/0267883 A1 | 11/2011 | Lee et al. | |
| 2011/0317496 A1 | 12/2011 | Bunce et al. | |
| 2012/0005397 A1 | 1/2012 | Lim et al. | |
| 2012/0017039 A1 | 1/2012 | Margetts | |
| 2012/0023281 A1 | 1/2012 | Kawasaki et al. | |
| 2012/0120705 A1 | 5/2012 | Mitsubori et al. | |
| 2012/0134216 A1 | 5/2012 | Singh | |
| 2012/0134225 A1 | 5/2012 | Chow | |
| 2012/0134226 A1 | 5/2012 | Chow | |
| 2012/0140540 A1 | 6/2012 | Agam et al. | |
| 2012/0182798 A1 | 7/2012 | Hosono et al. | |
| 2012/0195146 A1 | 8/2012 | Jun et al. | |
| 2012/0198310 A1 | 8/2012 | Tran et al. | |
| 2012/0246380 A1* | 9/2012 | Akerib | G11C 7/1006 711/5 |
| 2012/0265964 A1 | 10/2012 | Murata et al. | |
| 2012/0281486 A1 | 11/2012 | Rao et al. | |
| 2012/0303627 A1 | 11/2012 | Keeton et al. | |
| 2013/0003467 A1 | 1/2013 | Klein | |
| 2013/0061006 A1 | 3/2013 | Hein | |
| 2013/0107623 A1 | 5/2013 | Kavalipurapu et al. | |
| 2013/0117541 A1 | 5/2013 | Choquette et al. | |
| 2013/0124783 A1 | 5/2013 | Yoon et al. | |
| 2013/0132702 A1 | 5/2013 | Patel et al. | |
| 2013/0138646 A1 | 5/2013 | Sirer et al. | |
| 2013/0163362 A1 | 6/2013 | Kim | |
| 2013/0173888 A1 | 7/2013 | Hansen et al. | |
| 2013/0205114 A1 | 8/2013 | Badam et al. | |
| 2013/0219112 A1 | 8/2013 | Okin et al. | |
| 2013/0227361 A1 | 8/2013 | Bowers et al. | |
| 2013/0283122 A1 | 10/2013 | Anholt et al. | |
| 2013/0286705 A1 | 10/2013 | Grover et al. | |
| 2013/0326154 A1 | 12/2013 | Haswell | |
| 2013/0332707 A1 | 12/2013 | Gueron et al. | |
| 2014/0185395 A1 | 7/2014 | Seo | |
| 2014/0215185 A1 | 7/2014 | Danielsen | |
| 2014/0247673 A1 | 9/2014 | Muralimanohar et al. | |
| 2014/0250279 A1 | 9/2014 | Manning | |
| 2014/0281371 A1 | 9/2014 | Thantry et al. | |
| 2014/0344934 A1 | 11/2014 | Jorgensen | |
| 2015/0089166 A1 | 3/2015 | Kogge | |
| 2015/0134713 A1 | 5/2015 | Wheeler | |
| 2015/0324290 A1 | 11/2015 | Leidel | |
| 2015/0325272 A1 | 11/2015 | Murphy | |
| 2015/0357047 A1* | 12/2015 | Tiwari | G06F 9/30029 714/719 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 100821616 B1 * | 4/2008 |
| KR | 10-2010-0134235 | 12/2010 |
| KR | 10-2013-0049421 | 5/2013 |
| TW | 485601 | 5/2002 |
| TW | 200532708 | 10/2005 |
| TW | 201218070 | 5/2012 |
| TW | 201346724 | 11/2013 |
| WO | 0165359 | 9/2001 |
| WO | 2010079451 | 7/2010 |
| WO | 2013062596 A1 | 5/2013 |
| WO | 2013081588 | 6/2013 |
| WO | 2013095592 | 6/2013 |

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

(56) References Cited

OTHER PUBLICATIONS

U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
Boyd et al., "On the General Applicability of Instruction-Set Randomization", Jul.-Sep. 2010, (14 pgs.), vol. 7, Issue 3, IEEE Transactions on Dependable and Secure Computing.
Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, mailed Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Warren JR., Henry S., "Hacker's Delight", Second Edition, Oct. 2013, pp. 181-184 and 194.

\* cited by examiner

| STEP # | 431 COMP_COMP | 476 DYNAMIC_MASK | 478 STATIC_MASK | 488 SRCA | 490 SRCB | 492 DEST | 494 DEST+1 |
|---|---|---|---|---|---|---|---|
| 1 | 0X80000000 | 0X80000000 |  | 0X0309020C | 0X0705080C | 0X00000000 | 0X00000000 |
| 2 | 0X80808080 | 0X80808080 |  | 0X0309020C | 0X0705080C | 0X00000000 | 0X00000000 |
| 3 | 0X7F7F7F7F | 0X80808080 | 0X7F7F7F7F | 0X0309020C | 0X0705080C | 0X00000000 | 0X00000000 |
| 4 | 0X40404040 | 0X40404040 | 0X7F7F7F7F | 0X0309020C | 0X0705080C | 0X00000000 | 0X00000000 |
| 5 | 0X00000000 | 0X00000000 | 0X7F7F7F7F | 0X0309020C | 0X0705080C | 0X00080200 | 0X04040800 |
| 6 | 0X07080C00 | 0X80808080 | 0X7F7F7F7F | 0X0309020C | 0X0705080C | 0X000F0300 | 0X07070F00 |
| 7 | 0X070F0F00 | 0X80808080 | 0X7F7F7F7F | 0X0309020C | 0X0705080C | 0X00080000 | 0X07000C00 |
| 8 | 0X00000000 | 0X00000000 | 0X7F7F7F7F | 0X0309020C | 0X0705080C | 0X000F0000 | 0X07000F00 |
| 9 | 0X00000000 | 0X00000000 | 0X7F7F7F7F | 0X0309020C | 0X0705080C | 0X007F0000 | 0X7F007F00 |
| 10 | 0XFF00FF00 | 0X00000000 | 0X7F7F7F7F | 0X0309020C | 0X0705080C | 0X00FF0000 | 0XFF00FF00 |

*Fig. 4*

| | | 1244 | 1245 | 1256 | 1270 | 1271 |
| --- | --- | --- | --- | --- | --- | --- |
| | | A | B | NOT OPEN | OPEN TRUE | OPEN INVERT |
| | | 0 | 0 | 0 | 0 | 1 |
| | | 0 | 1 | 0 | 1 | 0 |
| 1275 → ⋈ | | | | | | |
| | | 1 | 0 | 1 | 0 | 1 |
| | | 1 | 1 | 1 | 1 | 0 |

| | | | | | | | | | | | |
| --- | --- | --- | --- | --- | --- | --- | --- | --- | --- | --- | --- |
| | FF | 0 | 0 | 0 | 0 | 0 | 0 | 1 | 1 | 1 | ← 1276 |
| | FT | 0 | 0 | 0 | 1 | 1 | 1 | 0 | 0 | 0 | ← 1277 |
| | TF | 0 | 0 | 1 | 0 | 0 | 1 | 0 | 0 | 1 | ← 1278 |
| | TT | 0 | 1 | 0 | 0 | 1 | 0 | 0 | 1 | 0 | ← 1279 |
| A | B | A | A*B | A*B̄ | A+B | B | AXB | A+B̄ | $\overline{AXB}$ | B̄ | ← 1247 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 0 | 1 | 1 | 1 | 0 | 1 | |
| 1 | 1 | 1 | 1 | 0 | 1 | 1 | 0 | 1 | 1 | 0 | |

(1280 brace encompasses rows 1276–1279)

COMPARISON OPERATIONS IN MEMORY

PRIORITY INFORMATION

This application is a Non-Provisional of U.S. Provisional Application No. 62/045,178, filed Sep. 3, 2014, the contents of which are incorporated herein by reference.

TECHNICAL FIELD

The present disclosure relates generally to semiconductor memory apparatuses and methods, and more particularly, to apparatuses and methods related to performing comparison operations in a memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry (FUC)) such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the operations and/or data may also be sequenced and/or buffered.

In many instances, the processing resources (e.g., processor and/or associated FUC) may be external to the memory array, and data can be accessed (e.g., via a bus between the processing resources and the memory array) to execute instructions. Data can be moved from the memory array to registers external to the memory array via a bus.

BRIEF DESCRIPTION OF THE DRAWINGS

FIG. 4 illustrates a table showing the states of memory cells of an array at a particular phase associated with performing a comparison operation in accordance with a number of embodiments of the present disclosure.

DETAILED DESCRIPTION

Figure 1:
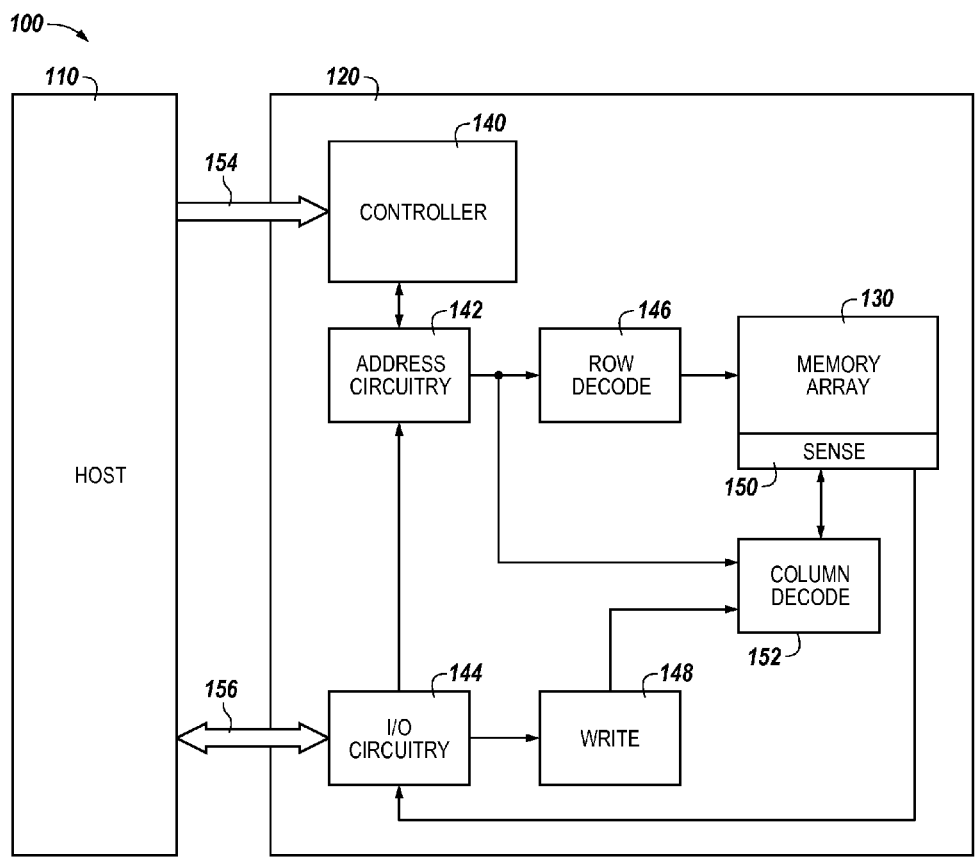
FIG. 1 is a block diagram of an apparatus in the form of a computing system including a memory device in accordance with a number of embodiments of the present disclosure.

The present disclosure includes apparatuses and methods related to performing comparison operations in a memory. An example apparatus can include a first group of memory cells coupled to a first access line and configured to store a plurality of first elements, and a second group of memory cells coupled to a second access line and configured to store a plurality of second elements. The apparatus can include a controller configured to cause the plurality of first elements to be compared with the plurality of second elements by controlling sensing circuitry to perform a number of operations without transferring data via an input/output (I/O) line, and the plurality of first elements and the plurality of second elements can be compared in parallel.

Comparing the plurality of first elements with the plurality of second elements can include performing the comparison operation on element pairs (e.g., data in the form of bit-vectors stored in an array). Performing the comparison operation on an element pair can include performing the comparison operation on a first element and a second element from the element pair. Performing the comparison operation on element pairs can include performing the comparison operation on a first element from the plurality of first elements and a first element from a plurality of second elements from a first element pair, on a second element from the plurality of first elements and a second element from the plurality of second elements from the second element pair, etc. Performing the comparison operation on element pairs may be described as performing a first comparison operation on a first element pair, a second comparison operation on a second element pair, etc.

The comparison operation can be performed on element pairs in parallel. For example, the comparison operation can be performed on elements from the first element pair and elements from the second element pair in parallel.

As used herein, the plurality of first elements and the plurality of second elements can be numerical values that are compared to (e.g., against) each other. For instance, a first value can be compared to a second value and/or the second value can be compared to the first value. A comparison operation can be used to determine whether the first value is equal to the second value or which of the first value and the second value is greater.

In a number of examples, an element can represent an object and/or other construct, which may be represented by a bit-vector. As an example, a comparison operation can be performed to compare objects by comparing the bit-vectors that represent the respective objects.

As used herein in, variable length bit-vectors can refer to bit-vectors comprising different quantities of bits (e.g., a first bit-vector comprising eight (8) bits and a second bit-vector comprising four (4) bits). In a number of embodiments, elements of an element pair can comprise a same quantity of bits. For instance, the individual elements of each element pair of a plurality of element pairs being compared can comprise a same quantity of bits. In this example, the individual elements of other element pairs of the plurality of element pairs being compared may be also comprise a same quantity of bits; however, the element pairs can comprise different quantities of bits with respect to each other. A number of embodiments of the present disclosure can provide a reduction of the number of operations (e.g., computations, functions, etc.) and/or time involved in performing a number of comparison operations (e.g., compare functions) relative to previous approaches. For instance, the number of computations and/or the time can be reduced due to an ability to perform various comparison operations in parallel (e.g., simultaneously). Performing a number of comparison operations as described herein can also reduce power consumption as compared to previous approaches. In accordance with a number of embodiments, a comparison operation can be performed on elements without transferring data out of the memory array and/or sensing circuitry via a bus (e.g., data bus, address bus, control bus, etc.). A comparison operation can involve performing a number of logical operations in parallel. For example, a comparison operation can be performed by a controller configured to compare the plurality of first elements with the plurality of second elements by controlling sensing circuitry to perform a number of operations without transferring data via an input/output (I/O) line. Performing a number of logical operations can include performing AND operations in parallel, OR operations in parallel, SHIFT operations in parallel, INVERT operations in parallel, etc. However, embodiments are not limited to these examples.

In various previous approaches, elements (e.g., a first data value and a second data value) to be compared may be transferred from the array and sensing circuitry to a number of registers via a bus comprising input/output (I/O) lines. The number of registers can be used by a processing resource such as a processor, microprocessor, and/or compute engine, which may comprise ALU circuitry and/or other functional unit circuitry configured to perform the appropriate logical operations. However, often only a single comparison function can be performed by the ALU circuitry, and transferring data to/from memory from/to registers via a bus can involve significant power consumption and time requirements. Even if the processing resource is located on a same chip as the memory array, significant power can be consumed in moving data out of the array to the compute circuitry (e.g., ALU), which can involve performing a sense line address access (e.g., firing of a column decode signal) in order to transfer data from sense lines onto I/O lines, moving the data to the array periphery, and providing the data to a register in association with performing a comparison operation, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M," "N," "J," "R," "S," "U," "V," "X," "Y," and "W," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 230 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 160 in accordance with a number of embodiments of the present disclosure. As used herein, a memory device 160, a memory array 130, and/or sensing circuitry 150 might also be separately considered an "apparatus."

In this example, system 100 includes a host 110 coupled to memory device 160, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 160 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 160 may include a number of arrays 130 (e.g., a number of banks of DRAM cells). An example DRAM array is described in association with FIG. 2.

The memory device 160 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of controller.

An example of the sensing circuitry 150 is described further below in association with FIG. 2. For instance, in a number of embodiments, the sensing circuitry 150 can comprise a number of sense amplifiers and a number of compute components, which may comprise an accumulator and can be used to perform logical operations (e.g., on data associated with complementary sense lines). In a number of embodiments, the sensing circuitry (e.g., 150) can be used to perform comparison operations using data stored in array 130 as inputs and store the results of the comparison operations back to the array 130 without transferring via a sense line address access (e.g., without firing a column decode signal). As such, a comparison operation can be performed using sensing circuitry 150 rather than and/or in addition to being performed by processing resources external to the sensing circuitry 150 (e.g., by a processor associated with host 110 and/or other processing circuitry, such as ALU circuitry, located on device 160 (e.g., on controller 140 or elsewhere)).

In various previous approaches, data associated with a comparison operation, for instance, would be read from memory via sensing circuitry and provided to an external ALU. The external ALU circuitry would perform the comparison functions using the elements (which may be referred to as operands or inputs) and the result could be transferred back to the array via the local I/O lines. In contrast, in a number of embodiments of the present disclosure, sensing circuitry (e.g., 150) is configured to perform a comparison operation on data stored in memory cells in memory array 130 and store the result back to the array 130 without enabling a local I/O line coupled to the sensing circuitry.

As such, in a number of embodiments, registers and/or an ALU external to array 130 and sensing circuitry 150 may not be needed to perform the comparison function as the sensing circuitry 150 can perform the appropriate computations involved in performing the comparison function using the address space of memory array 130. Additionally, the comparison operation can be performed without the use of an external processing resource.

Figure 2A:
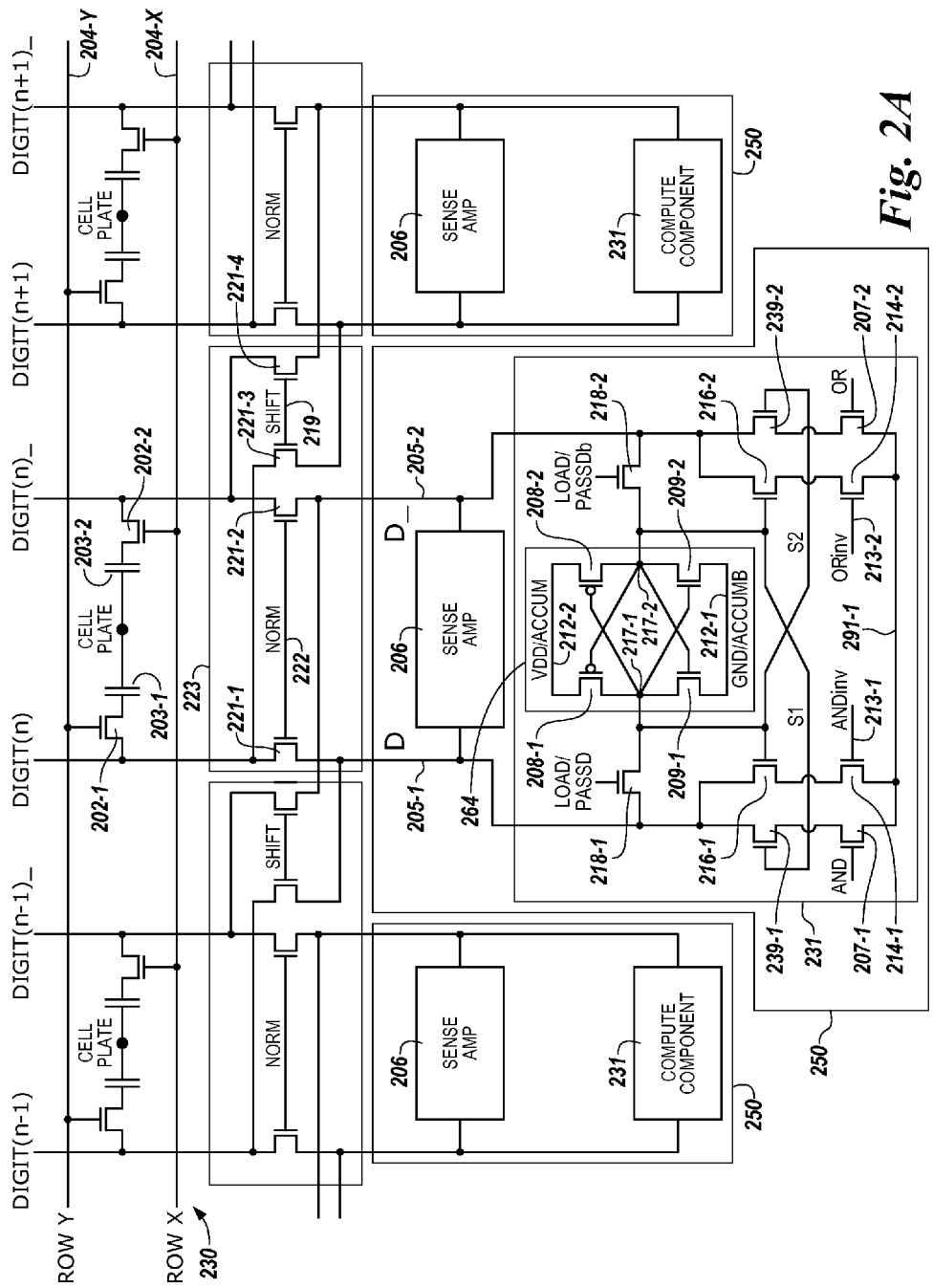
FIG. 2A illustrates a schematic diagram of a portion of a memory array in accordance with a number of embodiments of the present disclosure.

FIG. 2A illustrates a schematic diagram of a portion of a memory array 230 including sensing circuitry 250 in accordance with a number of embodiments of the present disclosure. In FIG. 2A, a memory cell comprises a storage element (e.g., capacitor) and an access device (e.g., transistor). For instance, a first memory cell comprises transistor 202-1 and capacitor 203-1, and a second memory cell comprises transistor 202-2 and capacitor 203-2. In this example, the memory array 230 is a DRAM array of 1T1C (one transistor one capacitor) memory cells; however, embodiments are not so limited. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines (e.g., DIGIT(n−1)/DIGIT(n−1)_, DIGIT(n)/DIGIT(n)_, DIGIT(n+1)/DIGIT(n+1)_). The individual data lines corresponding to each pair of complementary data lines can also be referred to as data lines 205-1 (D) and 205-2 (D_), respectively. Although only three pair of complementary data lines are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1, a second source/drain region of transistor 202-1 can be coupled to capacitor 203-1, and a gate of a transistor 202-1 can be coupled to word line 204-Y. A first source/drain region of a transistor 202-2 can be coupled to data line 205-2, a second source/drain region of transistor 202-2 can be coupled to capacitor 203-2, and a gate of a transistor 202-2 can be coupled to word line 204-X. The cell plate, as shown in FIG. 2A, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sense amplifier 206 can comprise a cross coupled latch, which can be referred to herein as a primary latch. The sense amplifier 206 can be configured, for example, as described with respect to FIG. 2B.

In the example illustrated in FIG. 2A, the circuitry corresponding to compute component 231 comprises a static latch 264 and an additional ten transistors that implement, among other things, a dynamic latch. The dynamic latch and/or static latch of the compute component 231 can be collectively referred to herein as a secondary latch, which can serve as an accumulator. As such, the compute component 231 can operate as and/or be referred to herein as an accumulator. The compute component 231 can be coupled to each of the data lines 205-1 and 205-2 as shown in FIG. 2A. However, embodiments are not limited to this example. The transistors of compute component 231 can all be n-channel transistors (e.g., NMOS transistors); however, embodiments are not so limited.

In this example, data line 205-1 can be coupled to a first source/drain region of transistors 216-1 and 239-1, as well as to a first source/drain region of load/pass transistor 218-1. Data line 205-2 can be coupled to a first source/drain region of transistors 216-2 and 239-2, as well as to a first source/drain region of load/pass transistor 218-2.

The gates of load/pass transistor 218-1 and 218-2 can be commonly coupled to a LOAD control signal, or respectively coupled to a PASSD/PASSDB control signal, as discussed further below. A second source/drain region of load/pass transistor 218-1 can be directly coupled to the gates of transistors 216-1 and 239-2. A second source/drain region of load/pass transistor 218-2 can be directly coupled to the gates of transistors 216-2 and 239-1.

A second source/drain region of transistor 216-1 can be directly coupled to a first source/drain region of pull-down transistor 214-1. A second source/drain region of transistor 239-1 can be directly coupled to a first source/drain region of pull-down transistor 207-1. A second source/drain region of transistor 216-2 can be directly coupled to a first source/drain region of pull-down transistor 214-2. A second source/drain region of transistor 239-2 can be directly coupled to a first source/drain region of pull-down transistor 207-2. A second source/drain region of each of pull-down transistors 207-1, 207-2, 214-1, and 214-2 can be commonly coupled together to a reference voltage line 291-1 (e.g., ground (GND)). A gate of pull-down transistor 207-1 can be coupled to an AND control signal line, a gate of pull-down transistor 214-1 can be coupled to an ANDinv control signal line 213-1, a gate of pull-down transistor 214-2 can be coupled to an ORinv control signal line 213-2, and a gate of pull-down transistor 207-2 can be coupled to an OR control signal line.

The gate of transistor 239-1 can be referred to as node S1, and the gate of transistor 239-2 can be referred to as node S2. The circuit shown in FIG. 2A stores accumulator data dynamically on nodes S1 and S2. Activating the LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231 shown in FIG. 2A has the benefit of balancing the sense amplifier for functionality when the pull-down transistors 207-1, 207-2, 214-1, and 214-2 are conducting before the sense amplifier 206 is fired (e.g., during pre-seeding of the sense amplifier 206). As used herein, firing the sense amplifier 206 refers to enabling the sense amplifier 206 to set the primary latch and subsequently disabling the sense amplifier 206 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1, and transistor 216-2 (having a gate coupled to S1 of the dynamic latch) in series with transistor 214-2 (having a gate coupled to an ANDinv control signal line 213-2) can be operated to pull-down data line 205-2.

The latch 264 can be controllably enabled by coupling to an active negative control signal line 212-1 (ACCUMB) and an active positive control signal line 212-2 (ACCUM) rather than be configured to be continuously enabled by coupling to ground and $V_{DD}$. In various embodiments, load/pass transistors 208-1 and 208-2 can each having a gate coupled to one of a LOAD control signal or a PASSD/PASSDB control signal.

According to some embodiments, the gate of load/pass transistor 218-1 can be coupled to a PASSD control signal, and the gate of load/pass transistor 218-2 can be coupled to a PASSDb control signal. In the configuration in which the gates of transistors 218-1 and 218-2 are respectively coupled to one of the PASSD and PASSDb control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors.

For instance, load transistors can be constructed to handle loading associated with coupling data lines to the local dynamic nodes S1 and S2, and, pass transistors can be constructed to handle heavier loading associated with coupling data lines to an adjacent accumulator (e.g., through the shift circuitry 223, as shown in FIG. 2A). According to some embodiments, load/pass transistors 218-1 and 218-2 can be configured to accommodate the heavier loading corresponding to a pass transistor but be coupled and operated as a load transistor. Load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute component 231, including the latch 264, can comprise a number of transistors formed on pitch with the transistors of the corresponding memory cells of an array (e.g., array 230 shown in FIG. 2A) to which they are coupled, which may conform to a particular feature size (e.g., $4F^2$, $6F^2$, etc.). According to various embodiments, latch 264 includes four transistors 208-1, 208-2, 209-1, and 209-2 coupled to a pair of complementary data lines 205-1 and 205-2 through load/pass transistors 218-1 and 218-2. However, embodiments are not limited to this configuration. The latch 264 can be a cross coupled latch (e.g., gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2). As described further herein, the cross coupled latch 264 can be referred to as a static latch.

The voltages or currents on the respective data lines 205-1 and 205-2 can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
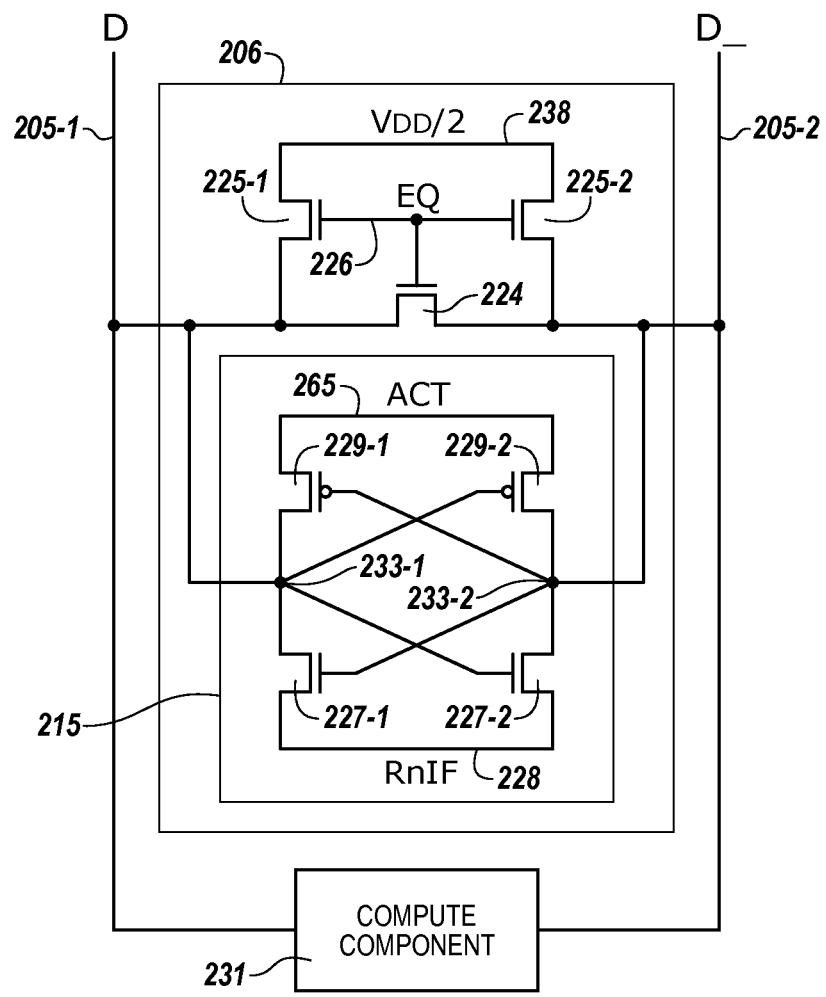
FIG. 2B illustrates a schematic diagram of a portion of a memory array in accordance with a number of embodiments of the present disclosure.

In this example, a second source/drain region of transistor 209-1 and 209-2 is commonly coupled to a negative control signal line 212-1 (e.g., ground (GND) or ACCUMB control signal similar to control signal RnIF shown in FIG. 2B with respect to the primary latch). A second source/drain region of transistors 208-1 and 208-2 is commonly coupled to a positive control signal line 212-2 (e.g., $V_{DD}$ or ACCUM control signal similar to control signal ACT shown in FIG. 2B with respect to the primary latch). The positive control signal 212-2 can provide a supply voltage (e.g., $V_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., $V_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., $V_{DD}$) or the activated negative control signal voltage (e.g., ground), and latch input 217-2 is driven to the complementary (e.g., other) of the activated positive control signal voltage (e.g., $V_{DD}$) or the activated negative control signal voltage (e.g., ground).

FIG. 2B illustrates a schematic diagram of a portion of a memory array in accordance with a number of embodiments of the present disclosure. According to various embodiments, sense amplifier 206 can comprise a cross coupled latch. However, embodiments of the sense amplifier 206 are not limited to a cross coupled latch. As an example, the sense amplifier 206 can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206) can comprise a number of transistors formed on pitch with the transistors of the corresponding compute component 231 and/or the memory cells of an array (e.g., 230 shown in FIG. 2A) to which they are coupled, which may conform to a particular feature size (e.g., $4F^2$, $6F^2$, etc.). The sense amplifier 206 comprises a latch 215 including four transistors coupled to a pair of complementary data lines 205-1 and 205-2. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). As described further herein, the latch 215 comprising transistors 227-1, 227-2, 229-1, and 229-2 can be referred to as a primary latch. However, embodiments are not limited to this example.

The voltages and/or currents on the respective data lines D and D can be provided to the respective latch inputs 233-1 and 233-2 of the cross coupled latch 215 (e.g., the input of the secondary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 233 (e.g., accumulator) can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an active negative control signal 228 (RnIF) A second source/drain region of transistors 229-1 and 229-2 is commonly coupled to an active positive control signal 265 (ACT). The ACT signal 265 can be a supply voltage (e.g., $V_{DD}$) and the RnIF signal can be a reference voltage (e.g., ground). Activating signals 228 and 265 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines 205-1 and 205-2 (e.g., in association with preparing the sense amplifier for a sensing operation). In this example, the equilibration circuitry comprises a transistor 224 having a first source/drain region coupled to a first source/drain region of transistor 225-1 and data line 205-1. A second source/drain region of transistor 224 can be coupled to a first source/drain region of transistor 225-2 and data line 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 225 (EQ). As such, activating EQ enables the transistors 224, 225-1, and 225-2, which effectively shorts data line 205-1 to data line 205-2 such that the data lines 205-1 and 205-2 are equilibrated to equilibration voltage $V_{DD}/2$. According to various embodiments of the present disclosure, a number of logical operations can be performed using the sense amplifier, and storing the result in the compute component (e.g., accumulator).

As shown in FIG. 2A, the sense amplifier 206 and the compute component 231 can be coupled to the array 230 via shift circuitry 223. In this example, the shift circuitry 223 comprises a pair of isolation devices (e.g., isolation transistors 221-1 and 221-2) coupled to data lines 205-1 and 205-2, respectively). The isolation transistors 221-1 and 221-2 are coupled to a control signal 222 (NORM) that, when activated, enables (e.g., turns on) the isolation transistors 221-1 and 221-2 to couple the corresponding sense amplifier 206 and compute component 231 to a corresponding column of memory cells (e.g., to a corresponding pair of complementary data lines 205-1 and 205-2). According to various embodiments, conduction of isolation transistors 221-1 and 221-2 can be referred to as a "normal" configuration of the shift circuitry 223.

In the example illustrated in FIG. 2A, the shift circuitry 223 includes another (e.g., a second) pair of isolation devices (e.g., isolation transistors 221-3 and 221-4) coupled to a complementary control signal 219 (SHIFT), which can be activated, for example, when NORM is deactivated. The isolation transistors 221-3 and 221-4 can be operated (e.g., via control signal 219) such that a particular sense amplifier 206 and compute component 231 are coupled to a different pair of complementary data lines (e.g., a pair of complementary data lines different than the pair of complementary data lines to which isolation transistors 221-1 and 221-2 couple the particular sense amplifier 206 and compute component 231), or can couple a particular sense amplifier 206 and compute component 231 to another memory array (and isolate the particular sense amplifier 206 and compute component 231 from a first memory array). According to various embodiments, the shift circuitry 223 can be arranged as a portion of (e.g., within) the sense amplifier 206, for instance.

Although the shift circuitry 223 shown in FIG. 2A includes isolation transistors 221-1 and 221-2 used to couple particular sensing circuitry 250 (e.g., a particular sense amplifier 206 and corresponding compute component 231) to a particular pair of complementary data lines 205-1 and 205-2 (e.g., DIGIT(n) and DIGIT(n)_) and isolation transistors 221-3 and 221-4 are arranged to couple the particular sensing circuitry 250 to an adjacent pair of complementary data lines in one particular direction (e.g., adjacent data lines DIGIT(n+1) and DIGIT(n+1)_ shown to the right in FIG. 2A), embodiments of the present disclosure are not so limited. For instance, shift circuitry can include isolation transistors 221-1 and 221-2 used to couple particular sensing circuitry to a particular pair of complementary data lines (e.g., DIGIT(n) and DIGIT(n)_ and isolation transistors 221-3 and 221-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 2A).

Embodiments of the present disclosure are not limited to the configuration of shift circuitry 223 shown in FIG. 2A. In a number of embodiments, shift circuitry 223 such as that shown in FIG. 2A can be operated (e.g., in conjunction with sense amplifiers 206 and compute components 231) in association with performing various operations (e.g., logical and/or arithmetic operations) without transferring data out of the sensing circuitry 250 via an I/O line (e.g., I/O line 334 shown in FIG. 3), for instance. Although shift circuitry 223 is shown to be separate from sensing circuitry 250 (e.g., sensing circuitry 150 in FIG. 1), shift circuitry 223 can be considered to be part of sensing circuitry 250 (e.g., sensing circuitry 150 in FIG. 1).

Although not shown in FIG. 2A, each column of memory cells can be coupled to a column decode line (e.g., decode lines 310-0 to 310-W shown in FIG. 3) that can be activated to transfer, via local I/O line (e.g., I/O line 334 shown in FIG. 3), a data value from a corresponding sense amplifier 206 and/or compute component 231 to a control component external to the array such as an external processing resource (e.g., host processor and/or other functional unit circuitry). The column decode line can be coupled to a column decoder (e.g., column decoder 152 shown in FIG. 1). However, as described herein, in a number of embodiments, data need not be transferred via such I/O lines to perform logical operations in accordance with embodiments of the present disclosure. In a number of embodiments, shift circuitry 223 can be operated in conjunction with sense amplifiers 206 and compute components 231 to perform various operations (e.g., logical operations in association with performing subtraction, addition, multiplication, division, etc.) without transferring data to a control component external to the array, for instance.

The sensing circuitry 250 can be operated in several modes to perform logical operations, including a second mode in which a result of the logical operation is initially stored in the sense amplifier 206, and a first mode in which a result of the logical operation is initially stored in the compute component 231. Operation of the sensing circuitry 250 in the second mode is described below with respect to FIGS. 5 and 6, and operation of the sensing circuitry 250 in the second mode is described below with respect to FIGS. 7-10. Additionally, with respect to the first operating mode, sensing circuitry 250 can be operated in both pre-sensing (e.g., sense amps fired before logical operation control signal active) and post-sensing (e.g., sense amps fired after logical operation control signal active) modes with a result of a logical operation being initially stored in the sense amplifier 206.

As described further below, the sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations using less power than various previous approaches. Additionally, since a number of embodiments eliminate the need to transfer data across I/O lines (e.g., between memory and discrete processor) in order to perform various operations (e.g., compute functions), a number of embodiments can enable an increased parallel processing capability as compared to previous approaches.

Figure 3:
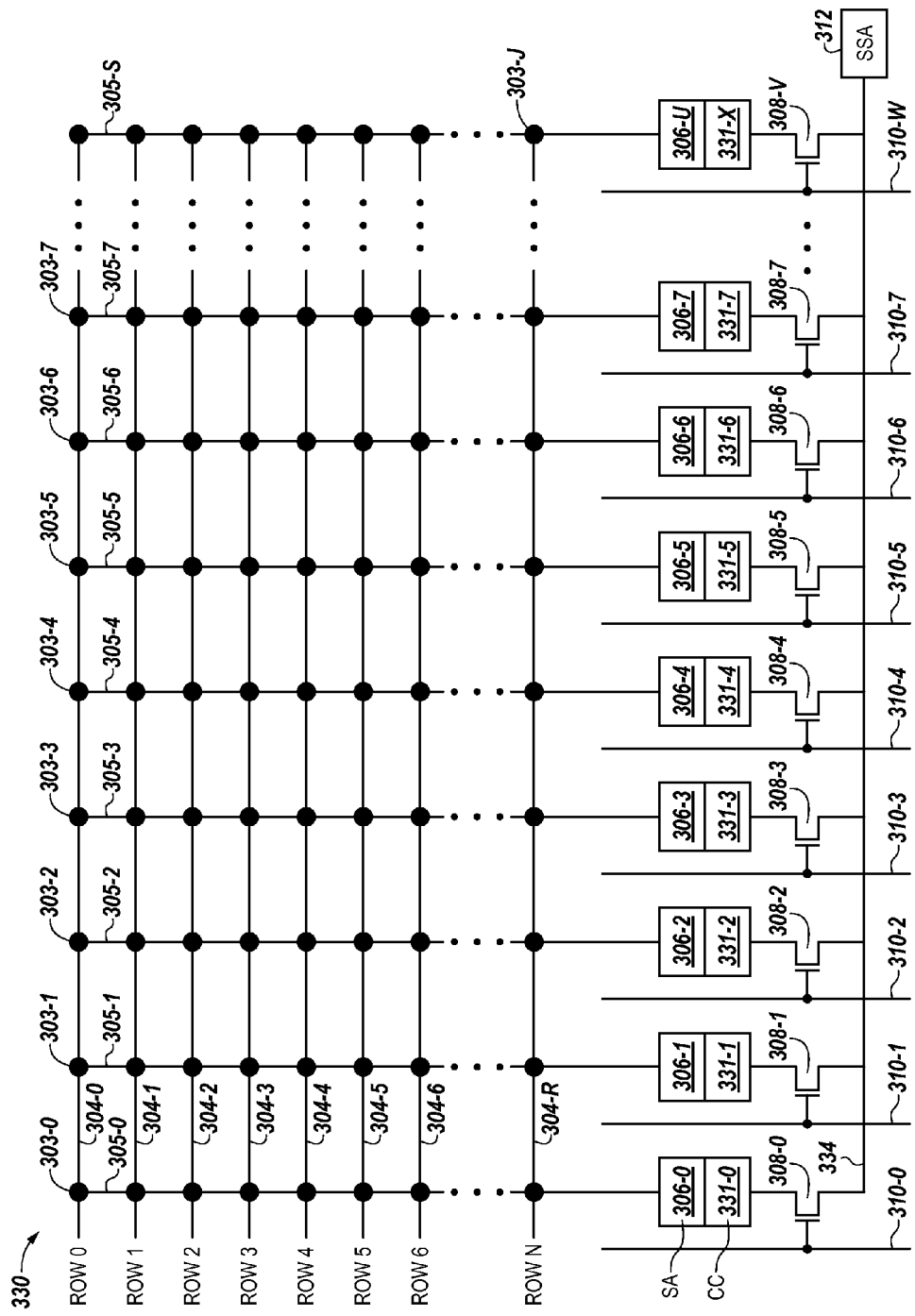
FIG. 3 illustrates a schematic diagram of a portion of a memory array in accordance with a number of embodiments of the present disclosure.

FIG. 3 illustrates a schematic diagram of a portion of a memory array 330 in accordance with a number of embodiments of the present disclosure. The array 330 includes memory cells 303-0, 303-1, 303-3, 303-4, 303-5, 303-6, 303-7, 303-8, . . . , 303-J (e.g., referred to generally as memory cells 303), coupled to rows of access lines 304-0, 304-1, 304-2, 304-3, 304-4, 304-5, 304-6, . . . , 304-R and columns of sense lines 305-0, 305-1, 305-2, 305-3, 305-4, 305-5, 305-6, 305-7, . . . , 305-S, which may be referred to generally as access lines 304 and sense lines 305. Memory array 330 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

Each column of memory cells can be coupled to sensing circuitry (e.g., sensing circuitry 150 shown in FIG. 1 and sensing circuitry 250 shown in FIG. 2A). In this example, the sensing circuitry comprises a number of sense amplifiers 306-0, 306-1, 306-2, 306-3, 306-4, 306-5, 306-6, 306-7, . . . , 306-U (e.g., referred to generally as sense amplifiers 306) coupled to the respective sense lines 305-0, 305-1, 305-2, 305-3, 305-4, 305-5, 305-6, 305-7, . . . , 305-S. The sense amplifiers 306 are coupled to input/output (I/O) line 334 (e.g., a local I/O line) via access devices (e.g., transistors) 308-0, 308-2, 308-3, 308-4, 308-5, 308-6, 308-7, . . . , 308-V. In this example, the sensing circuitry also comprises a number of compute components 331-0, 331-2, 331-3, 331-4, 331-5, 331-6, 331-7, . . . , 331-X (e.g., referred to generally as compute components 331) coupled to the respective sense lines. Column decode lines 310-0 to 310-W are coupled to the gates of transistors 308-0 to 308-V, respectively, and can be selectively activated to transfer data sensed by respective sense amplifiers 306-0 to 306-U and/or stored in respective compute components 331-0 to 331-X to a secondary sense amplifier 312 and/or to processing resources external to array 330 (e.g., via I/O line 334). In a number of embodiments, the compute components 331 can be formed on pitch with the memory cells of their corresponding columns and/or with the corresponding sense amplifiers 306.

The sensing circuitry (e.g., compute components 331 and sense amplifiers 306) is configured to perform a comparison operation in accordance with a number of embodiments described herein. The example given in FIG. 4 demonstrates how a comparison operation can be performed using data stored in array 330 as the inputs. The example involves using the elements (e.g., operands comprising bits corresponding to logic "1" or logic "0") stored in the memory cells coupled to access lines 304-0 to 304-R and commonly coupled to sense lines 305-0 to 305-S as the respective inputs to the comparison operation. The result of the comparison operation can be stored in array 330 and/or can be transferred external to the array 330 (e.g., to functional unit circuitry of a host).

FIG. 4 illustrates a table showing the states of memory cells of an array at a number of particular phases associated with performing a comparison operation in accordance with a number of embodiments of the present disclosure. Column 496 of the table provides reference numbers (e.g., 1-10) for the rows of the table, and the reference numbers shown in the table correspond to the respective reference numbers of the pseudocode described below. The bit-vector values for each of the bit-vectors 476 (Dynamic_Mask), 478 (Static_Mask), 488 (Srca), 490 (Srcb), 492 (Dest), and 494 (Dest+1) are stored in the array at various comparison operation phases corresponding to reference numbers 1-10.

The bit-vectors 476 and 478, can be stored in respective groups of memory cells coupled to particular access lines, which may be referred to as temporary storage rows 470 (e.g., rows that store data that may be updated during various phases of a comparison operation). The bit-vectors 488, 490, 492, and 494 can be referred to as vector arguments 472. FIG. 4 also indicate the bit-vector values for a bit-vector 431 (Comp_Comp) stored in compute components (e.g., 331 shown in FIG. 3) of the array.

In FIG. 4 the values of the bit-vectors corresponding to the temporary storage rows 470 and/or the vector arguments 472 are shown in hexadecimal format although the corresponding bit-vectors operated on during the comparison operation can be stored as binary bit patterns in the array. For example, a Srca bit-vector 488 (e.g., [0000 0011, 0000 1001, 0000 0010, 0000 1100] can be represented as [03, 09, 02, 0c] in hexadecimal format. The values shown in FIG. 4 are shown in hexadecimal format for ease of reference.

In the examples used herein, bit-vector values may include commas and/or spaces for ease of reference. For instance, a bit-vector represented in hexadecimal notation as [03, 09, 02, 0c] can correspond to four 8-bit wide vector elements, with the four elements separated by a respective comma and space. However, the same bit-vector can be represented as [03 09 02 0c] (e.g., without commas) and/or as [0309020c] (e.g., without commas and without spaces).

As used herein, an N-bit wide bit-vector refers to a vector having a length of N bits (e.g., the terms length and width are used interchangeably with respect to the size of a bit-vector, such that a 4-bit wide bit-vector has a length of 4-bits).

In FIG. 4 changes to the bit-vectors corresponding to Comp_Comp 431, the bit-vectors corresponding to the temporary storage rows 470 (e.g., Dynamic_Mask 476 and Static_Mask 478), and the bit-vectors corresponding to vector arguments 472 (e.g., Srca 488, Srcb 490, Dest 492, and Dest+1 494) are indicated in bold font. For example, at reference 1, Srca 488, Srcb 490, Dest 492, and Dest+1 494 are shown in bold font indicating values of the respective bit-vectors have changed during an operation phase to which the reference number corresponds.

In the example shown in FIG. 4, each of Srca 488 (e.g., a bit-vector [0309020c]) and Srcb 490 (e.g., a bit-vector [0705080c]) comprise four elements and are associated with four separate comparison operations. Each of the four separate comparison operations can be performed in parallel. Performing a number of comparison operations in parallel can include performing the number of comparison operation in single instruction multiple data (SIMD) fashion. As used herein, SIMD can be defined as performing a same operation on multiple elements simultaneously.

For example, elements in a first element pair (e.g., 0C and 0C from Srca 488 and Srcb 490, respectively) are compared in a first comparison operation. Elements in a second element pair (e.g., 02 and 08 from Srca 488 and Srcb 490, respectively) are compared in a second comparison operation simultaneously with the first comparison operation. Elements in a third element pair (e.g., 09 and 05 from Srca 488 and Srcb 490, respectively) are compared in a third comparison operation simultaneously with the first comparison operation and the second comparison operation. Elements in a fourth element pair (e.g., 03 and 07 from Srca 488 and Srcb 490, respectively) are compared in a fourth comparison operation simultaneously with the first comparison operation, the second comparison operation, and the third comparison operation.

A first group of memory cells that store Srca 488 can be cells coupled to a particular access line (e.g., 304-0 in FIG. 3) and to a number of sense lines (e.g., 305-0 to 305-31 in FIG. 3). The second group of memory cells that store Srcb 490 can be cells coupled to a different particular access line (e.g., 304-1 in FIG. 3) and to a number of sense lines (e.g., 305-0 to 305-31 in FIG. 3).

The four elements of Srca 488 can be stored in the first group of memory cells. For example, a fourth element (e.g., 03) of Srca 488 can be stored in memory cells that are coupled to access line 304-0 and sense lines 305-24 to 305-31 in FIG. 3, a third element (e.g., 09) can be stored in memory cells that are coupled to access line 304-0 and sense lines 305-16 to 305-23 in FIG. 3, a second element (e.g., 02) can be stored in memory cells that are coupled to access line 304-0 and sense lines 305-8 to 305-15 in FIG. 3, and a first element (e.g., 0C) can be stored in memory cells that are coupled to access line 304-0 and sense lines 305-0 to 305-7 in FIG. 3.

The four elements of Srcb 490 can be stored in the second group of memory cells. For example, a fourth element (e.g., 07) of Srcb 490 can be stored in memory cells that are coupled to access line 304-1 and sense lines 305-24 to 305-31, a third element (e.g., 05) can be stored in memory cells that are coupled to access line 304-1 and sense lines 305-16 to 305-23, a second element (e.g., 08) can be stored in memory cells that are coupled to access line 304-1 and sense lines 305-8 to 305-15, and a first element (e.g., 0C) can be stored in memory cells that are coupled to access line 304-1 and sense lines 305-0 to 305-7.

Dynamic_Mask 476 and Static_Mask 478 include bit-vectors that are stored in a plurality of groups of memory cells. For instance, Dynamic_Mask 476 and Static_Mask 478 can be stored in memory cells that are coupled to respective access lines 304-2 to 304-3 and to sense lines 305-0 to 305-31.

In this example, the fourth element in scra 488 has a decimal value of 3, which can be represented by binary bit-vector [0000 0011]. The particular bits of the bit-vector can be stored in the cells coupled to access line 304-0 and to the corresponding respective sense lines 305-0 to 305-7 (e.g., the most significant bit (MSB) of the bit-vector can be stored in the ROW 0 cell coupled to sense line 305-0, the next least significant bit (LSB) can be stored in the ROW 0 cell coupled to sense line 305-1, . . . , and the LSB can be stored in the ROW 0 cell coupled to sense line 305-7) in FIG. 3. Similarly, the fourth element in Srcb 490 has a decimal value of 7, which can be represented by binary bit-vector [0000 0111], and the particular bits of the bit-vector can be stored in the cells coupled to access line 304-1 and to the corresponding respective sense lines 305-0 to 305-7. As such, the respective bits of the 8-bit wide bit-vectors representing the fourth element in Srca 488 and the fourth element in Srcb 490 can be stored in cells coupled to respective same sense lines. For instance, in this example, the MSBs of the bit-vectors are stored in cells coupled to sense line 305-0, the next least significant bits of the bit-vectors are stored in cells coupled to sense line 305-1, etc.

In a number of examples, the MSB of the bit-vectors can be stored in the ROW 0 cell coupled to sense line 305-7, the next LSB can be stored in the ROW 0 cell coupled to sense line 305-6, . . . , and the LSB can be stored in the ROW 0 cell coupled to sense line 305-0. For instance, the MSBs of the bit-vectors are stored in cells coupled to sense line 305-7, the next least significant bits of the bit-vectors are stored in cells coupled to sense line, 305-6, etc.

However, embodiments are not limited to this example. For instance, elements to be compared in accordance with embodiments described herein can be represented by bit-vectors having a length other than 8-bits. For instance, a first 64-bit wide bit-vector could represent four elements each represented by a 16-bit wide bit-vector and could be stored in cells coupled to access line 304-0 (and to sense lines 305-0 to 305-63), and a second 64-bit wide bit-vector could represent four elements each represented by a 16-bit wide bit vector and could be stored in cells coupled to access line 304-1 (and to sense lines 305-0 to 305-63). The four elements represented by the first 64-bit wide bit-vector can be compared to the respective four elements represented by the second 64-bit wide bit-vector in accordance with embodiments described herein.

In another example, a first 32-bit wide bit-vector could represent four elements having different lengths. For instance, a first element can be represented by an 8-bit wide bit-vector, a second element can be represented by a 4-bit wide bit-vector, a third element can be represented by a 12-bit wide bit-vector, and a fourth element can be represented by an 8-bit wide bit-vector and the four elements could be stored in cells coupled to access line 304-0 (and to sense lines 305-0 to 305-31). A second 32-bit wide bit-vector could also represent four elements corresponding to respective elements of the first 32-bit wide bit-vector. For instance, a first element can be represented by an 8-bit wide bit-vector, a second element can be represented by a 4-bit wide bit-vector, a third element can be represented by a 12-bit wide bit-vector, and a fourth element can be represented by an 8-bit wide bit-vector and could be stored in cells coupled to access line 304-1 (and to sense lines 305-0 to 305-31) The four elements represented by the first 32-bit wide bit-vector can be compared to the respective four elements represented by the second 32-bit wide bit-vector in accordance with embodiments described herein. Elements that are compared can have a same element length.

In a number of embodiments, the result of a comparison operation can be stored in a third group of memory cells, which can be cells coupled to a number of particular access lines (e.g., 304-0 to 304-R in FIG. 3). The third group of memory cells can be used to store a first bit-vector and/or a second bit-vector that indicates the result of the comparison operation. For instance, the bit-vector(s) stored in the third group of memory cells can indicate whether the particular elements in Srca 488 are greater than the corresponding particular elements in Srcb 490, whether the particular elements in Srcb 490 are greater than the corresponding particular element in Srca 488, and/or whether the particular elements in Srca 488 are equal to the corresponding particular elements Srcb 490. The third group of memory cells can, for example, be cells coupled to an access line 304-4 or cells coupled to at least one of access line 304-0 and access line 304-1. That is, the third group of memory cells can be a same group of memory cells as the first group of memory cells (e.g., the group of memory cells storing Srca 488) and/or the second group of memory cells (e.g., the group of memory cells storing Srcb 490). For instance, in the example above in which a 32-bit wide bit-vector represents four 8-bit wide elements, the third group of memory cells can be cells coupled to access line 304-0 and to sense lines 305-0 to 305-31 and/or cells coupled to access line 304-1 and to sense lines 305-0 to 305-31.

The group of memory cells storing the result of the comparison operation can also comprise a first number of memory cells coupled to a particular access line and a second number of memory cells coupled to a different particular access line. The first and second numbers of memory cells can store two different bit-vectors that together indicate the results of the comparison operation (e.g., in a 2-bit horizontal vector row). For example, a first result bit-vector can be stored in the first number of memory cells and a second result bit-vector can be stored in the second number of memory cells. Particular bit patterns of the first and second result bit-vectors can be used to indicate whether the particular elements in Srca 488 are greater than the corresponding particular elements in Srcb 490, whether the particular elements in Srcb 490 are greater than the corresponding particular elements in Srca 488, and/or whether the particular elements in Srca 488 are equal to the corresponding particular elements in Srcb 490. In a number of embodiments, the size of the result bit-vectors is the same as the size of the vector arguments (e.g., 488 and 490) and the quantity of bits of the result bit-vectors corresponding to the constituent elements is the same as the quantity of bits of the respective element pairs being compared.

As an example, "1" bits stored in the first result bit-vector and "0" bits stored in the corresponding bit positions of the second result bit-vector can be used to indicate that an element of a first bit-vector (e.g., 488) is greater (e.g., has a greater value) than a corresponding element of a second bit-vector (e.g., 490). Similarly, "0" bits stored in the first result bit-vector and "1" bits stored in the corresponding bit positions of the second result bit-vector can be used to indicate that an element of a first bit-vector (e.g., 488) is less than a corresponding element of a second bit-vector (e.g., 490). Also, a same bit value stored in the first result bit-vector and in the corresponding bit positions of the second result bit-vector can be used to indicate that an element of a first bit-vector (e.g., 488) is the same as a corresponding element of a second bit-vector (e.g., 490). For instance, consider a first vector "A" (e.g., a 32-bit wide bit-vector) comprising four 8-bit wide elements being compared to a corresponding four 8-bit wide elements of a second vector "B" (e.g., a 32-bit wide bit-vector), such that four element pairs are to be compared. Responsive to the first element of vector A being greater than the first element of vector B, the second element of vector A being less than the second element of vector B, and the third and fourth elements of vector A being equal to the third and fourth elements of vector B, the first result bit-vector could be [00000000, 00000000, 00000000, 11111111] (e.g., [00 00 00 FF] in hexadecimal format) and the second result bit-vector could be [00000000, 00000000, 11111111, 00000000] (e.g., [00 00 FF 00] in hexadecimal format).

As an example, the first result bit-vector can be stored in the cells coupled to access line 304-4 and to sense lines 305-0 to 305-31 shown in FIG. 3. The second result bit-vector can be stored in the cells coupled to access line 304-5 and to the sense lines 305-0 to 305-31, for instance. In a number of examples, the first result bit-vector and/or the second result bit-vector can be stored in cells coupled to an access line to which cells storing the first and/or second elements being compared are coupled. For instance, if a first element is stored in a first group of cells coupled to access line 304-0 and a second element is stored in a second group of cells coupled to access line 304-1, a third group of cells storing the first and the second result bit-vectors may comprise cells coupled to access lines 304-0 and 304-1 in FIG. 3, respectively.

It is noted that a determination of whether a first element is greater than a second element of a particular element pair may include a determination that the first element is not less than the second element, but may not identify whether the first element is equal to the second element. For instance, if the first element is not greater than the second element, then the second element may be greater than the first element or the first element may be equal to the second element. For instance, in the example above, a determination that the first result bit-vector stores "0s" in the bit positions corresponding to the particular element pair indicates either that the first element is less than the second element (e.g., if the second result bit-vector stores "1s" in the corresponding bit positions), or that the first element is the same as the second element (e.g., if the second result bit-vector stores "0s" in the corresponding bit positions).

Accordingly, a comparison operation can also include a determination of whether the second element is greater than the first element, which may include a determination that the second element is not less than the first element. However, a determination that the second element is not less than the first element may not identify whether the second element is equal to the first element. As such, a determination of the value of the first and the second result bit-vector may be needed to determine whether a particular element of an element pair is greater/less than its corresponding element and whether the particular element is equal to its corresponding element.

In a number of examples, performing a comparison operation on a first element and a second element can include performing a number of AND operations, OR operations, SHIFT operations, and INVERT operations without transferring data via an input/output (I/O) line. The number of AND operations, OR operations, INVERT operations, and SHIFT operations can be performed using sensing circuitry on pitch with memory cells corresponding to respective columns of complementary sense lines. In a number of examples, the number of AND operations, OR operations, SHIFT operations, and INVERT operations can be performed to compare a number of first elements with a number of second elements in parallel.

The below pseudocode represents instructions executable to perform a number of comparison operations in a memory in accordance with a number of embodiments of the present disclosure. The example pseudocode is referenced using reference numbers 1-10, which correspond to the respective reference numbers 1-10 shown in column 496 of the table shown in FIG. 4. For example, reference number one (1) corresponds to "Load Srca, Srcb" in the pseudocode, and reference number two (2) corresponds to "Find MSB and store in Comp_Comp, Dynamic_Mask" in the pseudocode.

1. Load Srca, Srcb.
2. Find MSB and store in Comp_Comp, Dynamic_Mask.
3. Find MSB by shifting right with fixed vector for each vector length in Comp_Comp.
4.a. If Dynamic_Mask was given then Write inverse to Static_Mask.
4.b. Else Store inverse into Static_Mask.
5. Get Srca>Srcb and Srcb>Srca into Dest, Dest+1.
6. Replicate right.
7. Get Dest>Dest+1 and Dest+1>Dest into Dest, Dest+1.
8. Replicate right.
9. Replicate left.
10. Last left bit replicate left.

For purposes of discussion, the above pseudocode will be divided into a setup phase and a comparison phase. The pseudocode referenced by reference numbers 1-4 can correspond to the setup phase. The pseudocode referenced by reference numbers 5-10 can correspond to the comparison phase. FIG. 4 illustrates the values of a number of bit-vectors stored in an array (e.g., 330) and associated with performing a comparison operation after the setup phase and the comparison phase. The comparison phase can be comprised of a plurality of replication phases.

In a number of examples, the results of the comparison operation can be stored in an array (e.g., array 330 in FIG. 3) without transferring data via an I/O line (e.g., I/O line 334). In a number of examples, the results of the comparison operation can be transferred to a location other than array 330 in FIG. 3.

The pseudocode corresponding to reference number 1 (e.g., "Load Srca, Srcb") is associated with storing the vectors comprising elements to be compared (e.g., Srca 488 and Srcb 490) into an array (e.g., the array 330 in FIG. 3). The vectors can be received, for example, from a host (e.g., 110) and stored in the array via write circuitry (e.g., 148). As described above, the vectors can include a number of element pairs to be compared. In this example, Srca 488 and Srcb 490 each include four 8-bit elements to be compared. For instance, the fourth element (e.g., [03]) of Srca is to be compared to the fourth element (e.g., [07]) of Srcb, the third element (e.g., [09]) of Srca is to be compared to the third element (e.g., [05]) of Srcb, the second element (e.g., [02]) of Srca is to be compared to the second element (e.g., [08]) of Srcb, and the first element (e.g., [0C]) of Srca is to be compared to the first element (e.g., [0C]) of Srcb. In this example, the bit-vector 492 (Dest) represents a first result bit-vector and the bit-vector 494 (Dest+1) represents a second result bit-vector. At the conclusion of the compare operation, "1" bits in bit-vector 492 and "0" bits in corresponding bit positions of bit-vector 494 indicate Srca is greater than Srcb (e.g., Srca>Srcb), "0" bits in bit-vector 492 and "1" bits in corresponding bit positions of bit-vector 494 indicate Srcb is greater than Srca (e.g., Srcb>Srca), and "0" bits in both bit-vector 492 and in the corresponding bit positions of bit-vector 494 indicate Srca is equal to Srcb (e.g., Srca=Srcb). As such, in this example, since the fourth element of Srca 488 is less than the fourth element of Srcb 490, the third element of Srca 488 is greater than the third element of Srcb 490, the second element of Srca 488 is less than the second element of Srcb 490, and the first element of Srca 488 is equal to the first element of Srcb 490, the expected result of the comparison operation is Dest 492 being [00 FF 00 00] (e.g., binary [00000000 11111111 00000000 00000000] and Dest+1 494 being [FF 00 FF 00] (e.g., binary [11111111 00000000 11111111 00000000]). Row 1 of the table shown in FIG. 4 illustrates the bit-vector [0309020C] being stored in a group of memory cells that store Srca 488, and the bit-vector [0705080C] being stored in a group of memory cells that store Srcb 490. Row 1 of the table in FIG. 4 also indicates the bit-vector [00000000] is stored in the groups of memory cells that store Dest 492 and Dest+1 494. For instance, in association with executing the pseudocode corresponding to reference number 1, the bit-vectors 492 and 494 can be "cleared" by setting their values to [00000000].

In a number of embodiments, a mask bit-vector (e.g., Dynamic_Mask 476) can be used to identify the most significant bit in each element and/or to perform a REPLICATION operation, as described further below. Another bit-vector (e.g., Static_Mask 478) can be used to indicate boundaries for each element in the bit-vectors being compared (e.g., Srca 488 and Srcb 490) (e.g., bit positions at which the respective elements begin and/or end).

The groups of memory cells corresponding to temporary storage rows 470 (e.g., the rows storing bit-vectors 476, 478, 480, and 482) may be oriented within memory 330 in a manner that facilitates performance of the comparison operation on the element pairs. For example, a plurality of groups of memory cells each storing the bit-vectors corresponding to respective temporary storage rows can be coupled to sense lines 305-0 to 305-31 in FIG. 3. Each group in the plurality of groups of memory cells can be coupled to a different access line (e.g., different access lines than those having cells coupled thereto that are used to store the bit-vectors 488 and 490).

The pseudocode referenced at reference numbers 2 and 3 is associated with determining a bit-vector that identifies the most significant bit (MSB) in each of the elements in the bit-vectors being compared (e.g., Srca 488 and/or Srcb 490). The elements can have a fixed (e.g., same or static) element length or a variable element length.

In a number of examples, a bit-vector that identifies the MSB in each element in Srca 488 and/or Srcb 490 can be given (e.g., provided by a user and/or host). Knowing the bit-vector that identifies the MSBs of the elements can provide the flexibility to perform the comparison operation on a plurality of elements that are represented by fixed length bit-vectors and/or variable length bit-vectors. For example, a bit-vector [1000 0000, 1000, 1000 0000 0000, 1000 0000] identifying the MSBs of the first element (e.g., an 8-bit element in the least significant element position), the second element (e.g., a 12-bit element), the third element (e.g., a 4-bit element), and the fourth element (e.g., another 8-bit element) can be provided and can be stored in memory cells that store the bit-vector indicating the MSBs of the elements (e.g., Dynamic_Mask 476). In this example, a bit pattern comprising a "1" in a MSB position and all "0s" in the remaining bit positions can be used to indicate the MSBs of the constituent elements of a bit-vector (e.g., Srca 488 and/or Srcb 490).

The pseudocode referenced at reference number 2 (e.g., "Find MSB and store in Comp_Comp, Dynamic_Mask") is associated with determining the MSB of the bit-vectors being compared (e.g., Srca 488 and Srcb 490) and storing a bit-vector indicating the MSB in particular groups of memory cells. The bit pattern indicating the most significant bit can be stored (e.g., as a bit-vector) in a group of memory cells used to store a mask (e.g., Dynamic_Mask 476). The bit pattern indicating the most significant bit can also be stored (e.g., as a latched bit-vector) in sensing circuitry (e.g., compute components 331 and/or sense amplifiers 306 in FIG. 3) as Comp_Comp 431. As an example, a bit pattern comprising a "1" in a MSB position and all "0s" in the remaining bit positions can be used to indicate the MSB of Srca 488 and/or Srcb 490. For example, if Srca 488 and/or Srcb 490 are 32-bit wide bit-vectors and are stored in memory cells coupled to sense lines 305-0 to 305-31, then the 32-bit wide binary bit-vector [1000 0000 0000 0000 0000 0000 0000 0000] (e.g., hexadecimal bit-vector [80000000]) can be used as the bit-vector indicating the MSB in Srca 488 and/or Srcb 490.

In a number of examples, the compute components 331-0 to 331-32 in FIG. 3 can latch the respective bits of the bit-vector [1000 0000 0000 0000 0000 0000 0000 0000]. For example, the compute component 331-0 can latch a one (1) bit while the compute components 331-1 to 331-31 can latch zero (0) bits.

The bit-vector (Dynamic_Mask 476) that identifies the MSB of Srca 488 and Srcb 490 can be created by setting all of the bits in the sensing circuitry to a binary bit-vector [1111 1111 1111 1111 1111 1111 1111 1111]. A right SHIFT operation is performed on the sensing circuitry to create the binary bit-vector [0111 1111 1111 1111 1111 1111 1111 1111]. An INVERT is performed on the sensing circuitry to create the binary bit-vector [1000 0000 0000 0000 0000 0000 0000 0000] that is stored in the memory cells that store the Dynamic_Mask 476.

The pseudocode referenced at reference number 3 (e.g., Find MSB by shifting right with fixed vector for each vector length in Comp_Comp) is associated with determining a bit-vector that indicates the MSBs corresponding to the respective elements represented by the bit-vectors being compared (e.g., Srca 488 and/or Srcb 490) if the bit-vector indicating the MSBs of the respective elements is not given. The bit-vector used to indicate the MSBs corresponding to the number of elements can be determined by performing a number of operations (e.g., a number of iterations of SHIFT operations and OR operations) on the bit-vector stored in the compute components (e.g., 331-0 to 331-31 in FIG. 3).

The SHIFT and OR iterations can result in a binary bit-vector [1000 0000, 1000 0000, 1000 0000, 1000 0000] (e.g., the hexadecimal bit-vector [80808080]) that comprises a "1" at the bit positions corresponding to the MSBs for each of the four elements represented by Srca 488 and/or Srcb 490. A number of SHIFT operations can be performed via a nested loop structure (e.g., a first FOR loop within a second FOR loop). A top loop structure (e.g., a FOR loop, a WHILE loop, and/or a DO loop, among other possible loop structures) can iterate through the number of elements in Srca 488 and/or Srcb 490. The lower loop structure (e.g., a FOR loop, a WHILE loop, and/or a DO loop, among other possible loop structures) can iterate through an element length. The SHIFT operations can be right SHIFT operations; however, embodiments are not limited to this example. The SHIFT operations can be performed on Comp_Comp 431 in the nested loop structure. The OR operations can be performed on Dynamic_Mask 476 and Comp_Comp 431 and can be performed in the top loop structure. The results of the SHIFT operations and the OR operations can be stored in a group of memory cells that store Dynamic_Mask 476 and the compute components (e.g., 331-0 to 331-31 in FIG. 3).

As used herein, performing a logical operation (e.g., AND operation and/or OR operation among other logical operations) on two bit-vectors can include performing the logical operation on bit pairs from the two bit-vectors in parallel. For example, an OR operation can be performed on a first bit-vector [0011] and a second bit-vector [1100] by performing an OR operation on a 0 bit from the first bit-vector [0011] and a 1 bit from the second bit-vector [1100], on a 0 bit from the first bit-vector [0011] and a 1 bit from the second bit-vector [1100], on a 1 bit from the first bit-vector [0011] and a 0 bit from the second bit-vector [1100], and on a 1 bit from the first bit-vector [0011] and a 0 bit form the second bit-vector [1100] in parallel. The result of the OR operation is a bit-vector [1111].

The pseudocode referenced at reference number 4a (e.g., If Dynamic_Mask 476 was given then Write inverse to Static_Mask) is associated with determining if the Dynamic_Mask 476 is provided and not created in association with reference numbers 2 and 3. If the Dynamic_Mask 476 is provided and not created then an INVERT operation is performed on the mask bit-vector indicating the MSBs of the elements being compared (e.g., Dynamic_Mask 476) and the result is stored as the static mask bit-vector (e.g., Static_Mask 478). As an example, Dynamic_Mask 476 can be loaded into Comp_Comp 431, an INVERT operation can be performed on the value stored in Comp_Comp 431, and the value of Comp_Comp 431 (e.g., the inverted value of Dynamic_Mask 476) can be copied to the cells storing Static_Mask 478. For instance, in a variable length element example, in which the mask bit vector indicating the MSBs of four variable length elements is [1000 0000, 1000, 1000 0000 0000, 1000 0000] (e.g., hexadecimal [80, 8, 800, 80]), inverting the value results in [0111 1111, 0111, 0111 1111 1111, 0111] (e.g., hexadecimal [7f, 7, 7ff, 7f]), which can be stored in memory cells that store the static mask bit-vector (e.g., 478). In a number of examples, the Dynamic_Mask 476 can be provided by a host and/or user and can indicate the lengths of the constituent elements of the Srca and Srcb bit-vectors (e.g., whether the elements are fixed length or variable length elements).

The pseudocode referenced at reference number 4.b (e.g., Store inverse into Static_Mask) is associated with performing an INVERT operation on the mask bit-vector (e.g., Dynamic_Mask 476) indicating the MSBs of the constituent elements of the vectors being compared (e.g., Srca 488 and Srcb 490) if the mask bit-vector (e.g., Dynamic_Mask 476) was not provided. The result of the INVERT operation (e.g., the inverse of Dynamic_Mask 476) is stored as a different mask bit-vector (e.g., Static_Mask 478). For example, row 4 of FIG. 4 illustrates the result (e.g., a hexadecimal bit-vector [7f7f7f7f]) of performing an INVERT operation on Dynamic_Mask 476 (e.g., hexadecimal bit-vector [80808080]) being stored as Static_Mask 478.

The pseudocode referenced at reference number 5 (e.g., Get Srca>Srcb and Srcb>Srca into Dest, Dest+1) is associated with identifying differences in the elements from Srca 488 as compared to the elements from Srcb 490. Identifying differences between Srca 488 and Srcb 490 can include identifying bits from elements from Srca 488 that are 1-bits and associated bits from elements from Srcb 490 that are 0-bits. The differences between Srca 488 and Srcb 490 are stored in memory cells that store Dest 492.

The pseudocode referenced at reference number 5 can also be associated with identifying differences in the elements from Srcb 490 as compared to the elements from Srca 488 by identifying bits from elements in Srcb 490 that are 1-bits and associated bits from elements from Srca 488 that are 0-bits. The result of identifying differences from Srcb 490 as compared to the elements from Srca 488 is stored in Dest+1 494. Dest 492 and Dest+1 494 are replicated in a replication phase below to compare the elements in Srca 488 with the elements in Srcb 490.

Performing the pseudocode referenced at reference number 5 can include performing an AND operation on the vectors being compared (e.g., Srca 488 and Srcb 490). For instance, Srca 488 (e.g., [0309020C]) can be stored in the sensing circuitry corresponding to Comp_Comp 431 and Comp_Comp 431 can be ANDed with Srcb 490 (e.g., [0705080c]). An INVERT operation can be performed on the result (e.g., [0301000C]) of the AND operation and can be stored in (e.g., written to) the cells corresponding to Dynamic_Mask 476 (e.g., as [FCFEFFF3], which is the inverse of [0301000C]). The result (e.g., [FCFEFFF3]) of the INVERT operation can remain in the sensing circuitry (e.g., as Comp_Comp 431).

Identifying bits from elements from Srca 488 that are 1-bits and associated bits from elements from Srcb 490 that are 0-bits can include performing an AND operation on the result (e.g., a bit-vector [FCFEFFF3]) of the INVERT operation and Srca (e.g., a bit-vector [0309020C]). An OR operation can be performed on the result (e.g., a bit-vector [00080200]) of the AND operation and Dest 492 (e.g., a bit-vector [00000000]). The result (e.g., a bit-vector [00080200]) is stored in the memory cells corresponding to Dest 492.

The 1-bits in Dest 492 (a binary bit-vector [0000 0000, 0000 1000, 0000 0010, 0000 0000]) indicate that associated bits in Srca 488 are greater than an associated bit in Srcb 490. For example, Dest 492 (e.g., a binary bit-vector [0000 0000, 0000 1000, 0000 0010, 0000 0000]) indicates that the third element (e.g., a bit-vector [0000 1001]) in Srca 488 has a 1-bit in the fourth index (e.g., the first index being the least significant bit and the eighth index being the most significant bit) and the third element (e.g., a binary bit-vector [0000 0101]) from Srcb 490 has a 0-bit in the fourth index. For instance, Dest 492 can indicate that the fourth index in the third element in Srca 488 is greater than a fourth index in the third element in Srcb 490.

Dest 492 (e.g., a binary bit-vector [0000 0000, 0000 1000, 0000 0010, 0000 0000]) can also indicate that the second element (e.g., a bit-vector [0000 0010]) in Srca 488 has a 1-bit in the second index and the second element (e.g., a binary bit-vector [0000 1000]) from Srcb 490 has a 0-bit in the second index. For instance, Dest 492 can also indicate that the second index in the second element from Srca 488 is greater than the second index in the second element from Srcb 490.

Identifying bits from elements in Srcb 490 that are 1-bits and associated bits from elements from Srca 488 that are 0-bits can include storing Dynamic_Mask 476 in the sensing circuitry and performing an AND operation on Comp_Comp 431 (e.g., a bit-vector [FCFEFFF3]) and Srcb 490 (e.g., a bit-vector [0705080C]). An OR operation can be performed on the results (e.g., a bit-vector [04040800]) of the AND operation and Dest+1 494 (e.g., a bit-vector [00000000]). The results (e.g., a bit-vector [04040800]) of the OR operation can be stored in memory cells that store Dest+1 494.

The pseudocode referenced at reference number 5 is also associated with preparing for a replication phase associated with reference number 6. Preparing for a replication phase can include performing an INVERT operation on Static_Mask 478 and storing the result in the memory cells corresponding to Dynamic_Mask 476.

Preparing for a replication phase can also include storing Dynamic_Mask 476 in the sensing circuitry (e.g., in the compute components and/or sense amplifiers corresponding to Comp_Comp 431) and performing a right SHIFT operation on Comp_Comp 431 (e.g., a bit-vector [80808080]). An AND operation can be performed on the result (e.g., a bit-vector [40404040]) of the right SHIFT operation and Static_Mask 478 (e.g., a bit-vector [7F7fFf7F]). The result (e.g., a bit-vector [40404040]) of the AND operation can be stored in the memory cells corresponding to Dynamic_Mask 476.

The pseudocode referenced at reference number 6 (e.g., "Replicate right") is associated with a replication phase. A replication phase can include a right or left replication phase. A replication phase can replicate a given bit to a number of bits that are associated with a lower index or to a number of bits that are associated with a higher index. As used herein, replicate is used to denote the change of a value of a given bit to the value of a different bit. For example, given a bit-vector [0100] that has a 1-bit in the third index and 0-bits in the first index, the second index, and the fourth index, the value of the third index (e.g., a 1-bit) can be replicated to the right and result in a bit-vector [0110]. As used herein, the 1-bits in Dest 492 and Dest+1 494 are replicated to setup a comparison of Dest 492 and Dest+1 494.

The pseudocode referenced at reference number 6 is associated with replicating bits to the right (e.g., replicating a value of a bit to a number of bits that are associated with a lower index). A replication phase can include performing a number of iterations of operations (e.g., "loop") via a FOR loop, a WHILE loop, and/or a DO loop, among other possible loop structures. As used herein, a "loop" can be defined as a control flow statement that allows a number of operations to be performed in a number of iterations based on a boolean condition. The "loop" can be used to perform a number of operations based on a BLOCKOR operation (e.g., boolean condition). For instance, a number of operations that are associated with a replication phase can be performed repeatedly while a BLOCKOR operation returns a true value (e.g., a "1"). A BLOCKOR operation can be performed on Comp_Comp 431.

As used herein, a BLOCKOR operation refers to an operation that can be performed to determine whether one or more bits of a particular bit-vector are a particular value (e.g., a "1"). For instance, a BLOCKOR can be performed to determine whether one or more bits of a bit-vector stored in the sensing circuitry (e.g., in the compute components and/or sense amplifiers corresponding to Comp_Comp 431) are a particular value (e.g., whether any of the bits of Comp_Comp 431 are a "1"). The BLOCKOR operation can be performed using an I/O line (e.g., 334) and a secondary sense amplifier (e.g., 312 in FIG. 3), for example.

In performing a BLOCKOR operation, the column decode lines (e.g., 310-1 to 310-W) coupled to the selected sensing circuitry (e.g., sense amplifiers 306 and/or compute components 331) can be activated in parallel (e.g., such that respective transistors 308-1 to 308-V are turned on) in order to transfer the voltages of the components of the sensing circuitry (e.g., sense amplifiers 306 and/or compute components 331) to the local I/O line (e.g., 334). The secondary sense amplifier (e.g., SSA 314) can sense whether the precharged voltage of the local I/O line changes (e.g., by more than a threshold amount) responsive to activation of the column decode lines.

For instance, if the I/O line 334 is precharged to a ground voltage and the sensing circuitry (e.g., one or more of the selected compute components 331 and/or sense amplifiers 306) stores a logic 1 (e.g., Vcc), then the SSA 312 can sense a pull up (e.g., increase) of the voltage on I/O line 334 which indicates that at least one of the compute components and/or sense amplifiers (e.g., at least one of the compute components and/or sense amplifiers corresponding to Comp_Comp 431) stores a "1". Alternatively, if the I/O line 334 is precharged to Vcc and one or more of the selected compute components and/or sense amplifiers stores a logic 0 (e.g., 0V), then the SSA 312 can sense a pull down (e.g., decrease) of the voltage on I/O line 334 which indicates that at least one of the compute components and/or sense amplifiers stores a "0". In this manner, voltages corresponding to data stored in sensing circuitry corresponding to Comp_Comp 431 can be transferred, in parallel, to the local I/O line 334 and sensed by SSA 312 as part of a BLOCKOR operation. Embodiments of the present disclosure are not limited to particular precharge voltages of local I/O line 334 and/or to particular voltage values corresponding to logic 1 or logic 0.

As such, in a number of examples, a BLOCKOR operation results in (e.g., returns) a "1" if any of the bits of the bit-vector on which the operation is being performed are a "1" and results in a "0" if none of the bits of the bit-vector on which the operation is being performed are a "1." Therefore, a BLOCKOR operation is effectively performing a logic "OR" operation on the particular bit-vector (e.g., the logic operation A OR B returns a true (e.g., "1") if either A or B is a "1" and false (e.g., "0") if neither A or B is a "1").

The pseudocode reference at reference number 6 is associated with using the Dynamic_Mask 476 as a counter in association with the BLOCKOR operation. For instance, Dynamic_Mask 476 can be used to determine how many times a particular bit is replicated. Dynamic_Mask 476 (e.g., a bit-vector [40404040]) can be stored in the sensing circuitry. After each iteration of the "loop" the Dynamic_Mask 476 can be stored in the sensing circuitry, a SHIFT operation can be performed on Comp_Comp 431 (e.g., a bit-vector [40404040]) and an AND operation can be performed on the result (e.g., a bit-vector [20202020]) of the SHIFT operation and the Static_Mask 478 (e.g., a bit-vector [7F7F7F7F]). The Static_Mask 478 can be used to perform the AND operation to restrict bits from an element from being shifted (e.g., moved) to a different element. The result (e.g., a bit-vector [20202020]) of the AND operation can be stored in memory cells that store the Dynamic_Mask 476. After a number of iterations the Dynamic_Mask 476 is a bit-vector [00000000]. The Dynamic_Mask 476 will be stored in the sensing circuitry and the BLOCKOR operation will return false (e.g., there are no 1-bits in Comp_Comp 431).

Each iteration of the "loop" that is associated with reference number 6 can include performing a number of operations. The number of operations can include performing SHIFT operations, OR operations, and/or AND operations to replicate Dest 492 and/or Dest+1 494 to the right.

Replicating Dest 492 can include storing Dest 492 in the sensing circuitry. A right SHIFT operation can be performed on Comp_Comp 431. An OR operation can be performed on the result of the SHIFT operation and Dest 492. An AND operation can be performed on the result of the OR operation and Static_Mask 478. The result of the AND operation can be stored in memory cells that store Dest 492.

Replicating Dest+1 494 can include storing Dest+1 494 in the sensing circuitry. A right SHIFT operation can be performed on Comp_Comp 431. An OR operation can be performed on the result of the SHIFT operation and Dest+1 494. An AND operation can be performed on the result of the OR operation and Static_Mask 478. The result of the AND operation can be stored in memory cells that store Dest+1 494.

Dest 492 is a bit-vector [000f0300] and Dest+1 494 is a bit-vector [04040800] after performing a number of iterations of operations associated with the pseudocode referenced in reference number 6.

The pseudocode referenced at reference number 7 (e.g., Get Dest>Dest+1 and Dest+1>Dest into Dest, Dest+1) is associated with identifying differences in Dest 492 as compared to Dest+1 494 by identifying bits from Dest 492 that are 1-bits and associated bits from Dest+1 494 that are 0-bits. The pseudocode referenced at reference number 7 can also be associated with identifying differences in Dest+1 494 as compared to Dest 492 by identifying bits from Dest+1 494 that are 1-bits and associated bits from Dest 492 that are 0-bits. The operations performed to identify the differences in Dest 492 as compared to Dest+1 and identifying differences in Dest+1 494 as compared to Dest 492 can be analogous to the operations performed in association with reference number 5.

For example, Dest 492 can be stored in the sensing circuitry. An AND operation can be performed on Comp_Comp 431 (e.g., a hexadecimal bit-vector [000F0300]) and Dest+1 494 (e.g., a bit-vector [07070F00]). A result (e.g., a bit-vector [FFF8FCFF]) of an INVERT operation that is performed on the result (e.g., a bit-vector [00070300]) of the AND operation and can be stored in memory cells that store Dynamic_Mask 476 and/or the sensing circuitry.

Identifying bits from Dest 492 that are 1-bits and associated bits from Dest+1 491 that are 0-bits can include performing an AND operation on the result (e.g., a bit-vector [FFF8FCFF]) of the INVERT operation and Dest 492 (e.g., a bit-vector [000F0300]). The result (e.g., a bit-vector [00080000]) is stored in the memory cells that store Dest 492.

Identifying bits from Dest+1 494 that are 1-bits and associated bits from Dest 492 that are 0-bits can include storing Dynamic_Mask 476 in the sensing circuitry and performing an AND operation on Comp_Comp 431 (e.g., a bit-vector [FFF8FCFF]) and Dest+1 494 (e.g., a bit-vector [07070f00]). The results (e.g., a bit-vector [07000c00]) of the AND operation can be stored in memory cells that store Dest+1 494.

The pseudocode referenced at reference number 7 is also associated with preparing for a replication phase associated with reference number 8. Preparing for a replication phase can include performing an INVERT operation on Static_Mask 478 and storing the result in memory cells that store Dynamic_Mask 476. Preparing for a replication phase can also include storing Dest 492 (e.g., a bit-vector [00080000]) in the sensing circuitry and performing an OR operation on Comp_Comp 431 (e.g., a bit-vector [00080000]) and Dest+1 494 (e.g., a bit-vector [07000000]).

The pseudocode referenced at reference number 8 (e.g., "Replicate right") is associated with a replication phase. The replication phase associated with reference number 8 is analogous to the replication phase associated with reference number 6. A replication phase referenced in reference number 8 replicates bits to the rights (e.g., replicating a value of a bit to a number of bits that are associated with a lower index). A replication phase can include performing a number of iterations of operations via a "loop". The "loop" can be used to perform a number of operations based on a BLOCKOR operation (e.g., boolean condition). For instance, a number of operations that are associated with a replication phase can be performed repeatedly while a BLOCKOR operation returns a true value (e.g., a "1"). A BLOCKOR operation can be performed on Comp_Comp 431.

The pseudocode referenced at reference number 8 is associated with using the Dynamic_Mask 476 as a counter in association with the BLOCKOR operation after a first iteration of the "loop". Dynamic_Mask 476 (e.g., a bit-vector [80808080]) can be stored in the sensing circuitry at each iteration (e.g., at the end of each iteration) of the "loop". A SHIFT operation can be performed on Comp_Comp 431 (e.g., a bit-vector [80808080]). An AND operation can be performed on the result (e.g., a bit-vector [40404040]) of the SHIFT operation and Static_Mask 478 (e.g., a bit-vector [7F7F7F7F]). The result (e.g., a bit-vector [40404040]) of the AND operation can be stored in memory cells that store the Dynamic_Mask 476. After a number of iterations the Dynamic_Mask 476 will be a bit-vector [00000000]. The Dynamic_Mask 476 will be stored in the sensing circuitry and the BLOCKOR operation will return false (e.g., there are no 1-bits in Comp_Comp 431).

Each iteration of the "loop" that is associated with reference number 8 can include performing a number of operations. The number of operations can include performing SHIFT operations, OR operations, and/or AND operations to replicate Dest 492 and/or Dest+1 494 to the right.

Replicating Dest 492 can include storing Dest 492 in the sensing circuitry. A right SHIFT operation can be performed on Comp_Comp 431. An OR operation can be performed on the result of the SHIFT operation and Dest 492. An AND operation can be performed on the result of the OR operation and Static_Mask 478. The result of the AND operation can be stored in memory cells that store Dest 492.

Replicating Dest+1 494 can include storing Dest+1 494 in the sensing circuitry. A right SHIFT operation can be performed on Comp_Comp 431. An OR operation can be performed on the result of the SHIFT operation and Dest+1 494. An AND operation can be performed on the result of the OR operation and Static_Mask 478. The result of the AND operation can be stored in memory cells that store Dest+1 494.

Dest 492 can be a bit-vector [000F0000] and Dest+1 494 can be a bit-vector [07000F00] after performing a number of iterations of operations associated with the pseudocode referenced at reference number 8. The pseudocode referenced at reference number 8 is also associated with preparing for a subsequent replication phase associated with reference number 9. Preparing for a replication phase can include performing an INVERT operation on Static_Mask 478 and storing the result in memory cells that store Dynamic_Mask 476. Preparing for a replication phase can also include storing Dest 492 (e.g., a bit-vector [000F0000]) in the sensing circuitry and performing an OR operation on Comp_Comp 431 (e.g., a bit-vector [000F0000]) and Dest+1 494 (e.g., a bit-vector [07000F00]). The result (e.g., a bit-vector [070F0F00]) of the OR operation can be stored in the sensing circuitry.

The pseudocode referenced at reference number 9 (e.g., "Replicate left") is associated with a replication phase. A replication phase corresponding to reference number 8 involves replicating bits to the left (e.g., replicating a value of a bit to a number of bits that are associated with a higher index). A replication phase can include performing a number of iterations of operations via a "loop". The "loop" can be used to perform a number of operations based on a BLOCKOR operation (e.g., boolean condition). For instance, a number of operations that are associated with a replication phase can be performed repeatedly while a BLOCKOR operation returns a true value (e.g., a "1").

The pseudocode reference at reference number 9 is associated with using the Dynamic_Mask 476 as a counter in association with the BLOCKOR operation after a first iteration of the "loop". Dynamic_Mask 476 (e.g., a bit-vector [80808080]) can be stored in the sensing circuitry at each iteration (e.g., at the end of each iteration) of the "loop". A SHIFT operation can be performed on Comp_Comp 431 (e.g., a bit-vector [80808080]). An AND operation can be performed on the result (e.g., a bit-vector [40404040]) of the SHIFT operation and Static_Mask 478 (e.g., a bit-vector [7F7F7F7F]). The result (e.g., a bit-vector [40404040]) of the AND operation can be stored in memory cells that store the Dynamic_Mask 476. After a number of iterations the Dynamic_Mask 476 will have be a bit-vector [00000000]. The Dynamic_Mask 476 will be stored in the sensing circuitry and the BLOCKOR operation will return false (e.g., there are no 1-bits in Comp_Comp 431).

Each iteration of the "loop" that is associated with reference number 9 can include performing a number of operations. The number of operations can include performing SHIFT operations (e.g., left SHIFT operations), OR operations, and/or AND operations to replicate Dest 492 and/or Dest+1 494 to the right.

Replicating Dest 492 can include storing Dest 492 in the sensing circuitry (e.g., such that the value of Comp_Comp 431 is the same as the value of Dest 492). A left SHIFT operation can be performed on Comp_Comp 431. An OR operation can be performed on the result of the left SHIFT operation (e.g., which is stored as Comp_Comp 431) and Dest 492. An AND operation can be performed on the result of the OR operation (e.g., which is stored as Comp_Comp 431) and Static_Mask 478. The result of the AND operation can be stored in memory cells corresponding to Dest 492 (e.g., by copying the value of Comp_Comp 431 to Dest 492).

Replicating Dest+1 494 can include storing Dest+1 494 in the sensing circuitry. A left SHIFT operation can be performed on Comp_Comp 431. An OR operation can be performed on the result of the left SHIFT operation and Dest+1 494. An AND operation can be performed on the result of the OR operation and Static_Mask 478. The result of the AND operation can be stored in memory cells that store Dest+1 494.

Dest 492 can be a bit-vector [007F0000] and Dest+1 494 can be a bit-vector [07007100] after performing a number of iterations of operations associated with the pseudocode referenced at reference number 9.

The pseudocode referenced at reference number 10 (e.g., "Last left bit replicate left.") is associated with a replicating the a bit with the next to highest index (e.g., bit with an index that has a value of 7) once to the left. The replication reference in reference number 10 replicates bits to the left (e.g., replicating a value of a bit to a number of bits that are associated with a higher index).

Replicating Dest 492 to the left can include storing Dest 492 in the sensing circuitry. A left SHIFT operation can be performed on Comp_Comp 431 (e.g., a bit-vector [007F0000]). An OR operation can be performed on the result (e.g., a bit-vector [00FE0000]) of the left SHIFT operation and Dest 492. The result (e.g., a bit-vector [00FF0000]) of the OR operation can be stored in memory cells that store Dest 492.

Replicating Dest+1 494 can include storing Dest+1 494 in the sensing circuitry. A left SHIFT operation can be performed on Comp_Comp 431 (e.g., a bit-vector [7f007f00]). An OR operation can be performed on the result (e.g., a bit-vector [fe00fe00]) of the left SHIFT operation and Dest+1 494. The result (e.g., a bit-vector [ff00ff00]) of the OR operation can be stored in memory cells that store Dest+1 494.

Dest 492 (e.g., a bit-vector [00ff0000]) indicates that the third element (e.g., a bit-vector [09]) in Srca 488 is greater than the third element (e.g., a bit-vector [05]) in Srcb 490. Dest+1 494 (e.g., a bit-vector [ff00ff00]) indicates that the fourth element (e.g., a bit-vector [07]) and a second element (e.g., a bit-vector [08]) from Srcb 490 are greater than the fourth element (e.g., a bit-vector [03]) and a second element (e.g., a bit-vector [02]) from Srca 488, respectively. Dest 492 (e.g., a bit-vector [00ff0000]) and Dest+1 494 (e.g., a bit-vector [ff00ff00]) together indicate that the first element (e.g., a bit-vector [0c]) from Srca 488 and the first element (e.g., a bit-vector [0c]) from Srcb 490 are equal. For instance, the "00" bits with a same index in both Dest+1 494 and Dest 492 indicate that the corresponding elements from Srcb 490 and Srca 488 are equal. Embodiments however, are not limited to the order of the sequence of instructions in the pseudocode in this example.

The functionality of the sensing circuitry 250 of FIG. 2A is described below and summarized in Table 1 below with respect to performing logical operations and initially storing a result in the sense amplifier 206. Initially storing the result of a particular logical operation in the primary latch of sense amplifier 206 can provide improved versatility as compared to previous approaches in which the result may initially reside in a secondary latch (e.g., accumulator) of a compute component 231, and then be subsequently transferred to the sense amplifier 206, for instance.

TABLE 1

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 206 (e.g., without having to perform an additional operation to move the result from the compute component 231 (e.g., accumulator) to the sense amplifier 206) is advantageous because, for instance, the result can be written to a row (of the array of memory cells) or back into the accumulator without performing a precharge cycle (e.g., on the complementary data lines 205-1 and/or 205-2).

Figure 5:
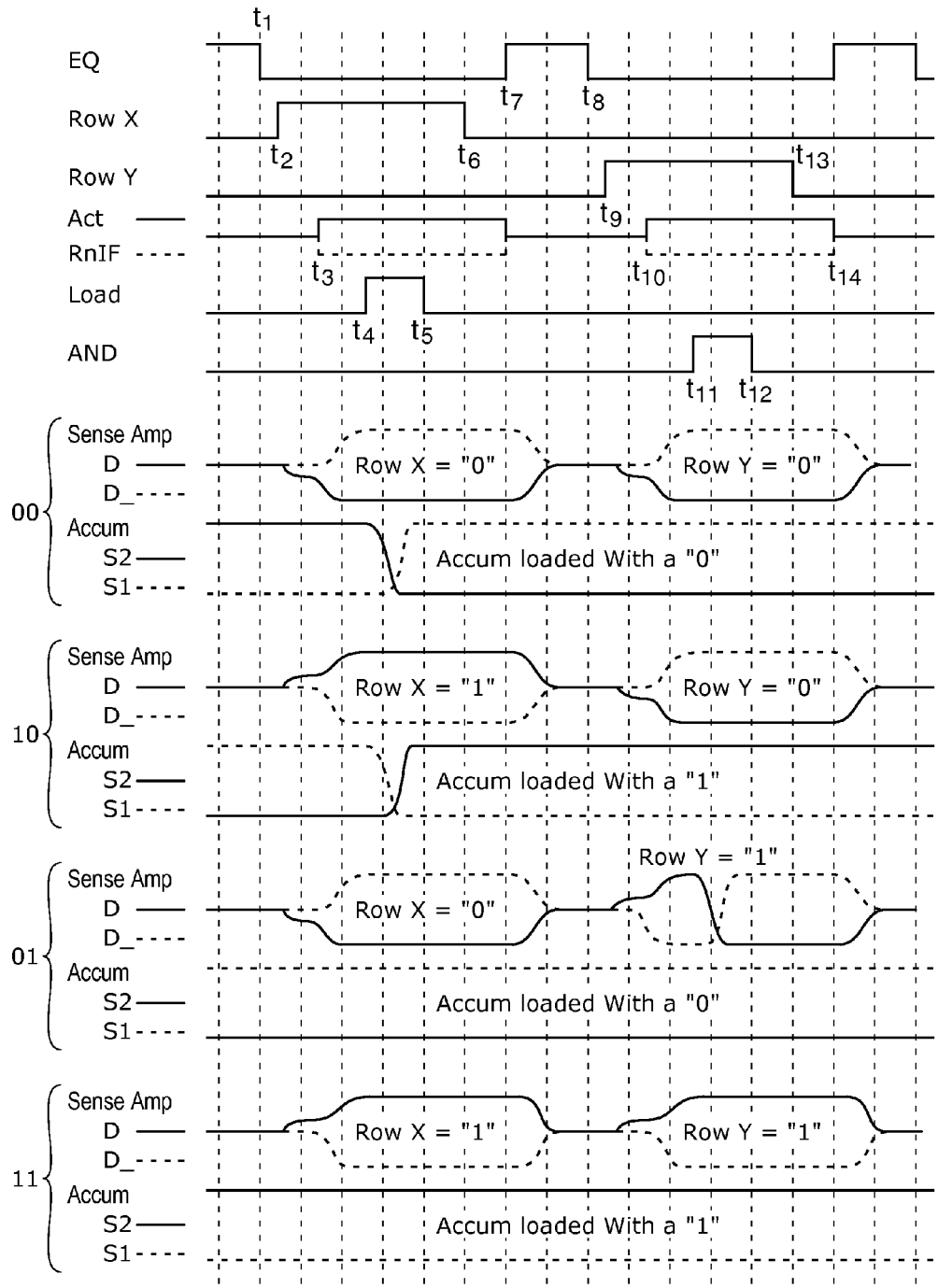
FIG. 5 illustrates a timing diagram associated with performing a number of logical operations using sensing circuitry in accordance with a number of embodiments of the present disclosure.

FIG. 5 illustrates a timing diagram associated with performing a number of logical operations using sensing circuitry in accordance with a number of embodiments of the present disclosure. FIG. 5 illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 5 illustrates a number of control signals associated with operating sensing circuitry (e.g., 250) to perform the AND logical operation. "EQ" corresponds to an equilibrate signal applied to the sense amp 206, "ROW X" corresponds to an activation signal applied to access line 204-X, "ROW Y" corresponds to an activation signal applied to access line 204-Y, "Act" and "RnIF" correspond to a respective active positive and negative control signal applied to the sense amp 206, "LOAD" corresponds to a load control signal (e.g., LOAD/PASSD and LOAD/PASSDb shown in FIG. 2A), and "AND" corresponds to the AND control signal shown in FIG. 2A. FIG. 5 also illustrates the waveform diagrams showing the signals (e.g., voltage signals) on the digit lines D and D_ corresponding to sense amp 206 and on the nodes S1 and S2 corresponding to the compute component 231 (e.g., Accum) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 2A.

An example of pseudo code associated with loading (e.g., copying) a first data value stored in a cell coupled to row 204-X into the accumulator can be summarized as follows:
  Copy Row X into the Accumulator:
    Deactivate EQ;
    Open Row X;
    Fire Sense Amps (after which Row X data resides in the sense amps);
    Activate LOAD (sense amplifier data (Row X) is transferred to nodes S1 and S2 of the Accumulator and resides there dynamically);
    Deactivate LOAD;
    Close Row X;
    Precharge;

In the pseudo code above, "Deactivate EQ" indicates that an equilibration signal (EQ signal shown in FIG. 5) corresponding to the sense amplifier 206 is disabled at $t_1$ as shown in FIG. 5 (e.g., such that the complementary data lines (e.g., 205-1 and 205-2) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 5. When the voltage signal applied to ROW X reaches the threshold voltage (Vt) of the access transistor (e.g., 202-2) corresponding to the selected cell, the access transistor turns on and couples the data line (e.g., 205-2) to the selected cell (e.g., to capacitor 203-2) which creates a differential voltage signal between the data lines.

After Row X is enabled (e.g., activated), in the pseudo code above, "Fire Sense Amps" indicates that the sense amplifier 206 is enabled to set the primary latch and subsequently disabled. For example, as shown at $t_3$ in FIG. 5, the ACT positive control signal (e.g., 265 shown in FIG. 2B) goes high and the RnIF negative control signal (e.g., 228 shown in FIG. 2B) goes low, which amplifies the differential signal between 205-1 and 205-2, resulting in a voltage (e.g., $V_{DD}$) corresponding to a logic 1 or a voltage (e.g., GND) corresponding to a logic 0 being on data line 205-1 (and the voltage corresponding to the other logic state being on complementary data line 205-2). The sensed data value is stored in the primary latch of sense amplifier 206. The primary energy consumption occurs in charging the data lines (e.g., 205-1 or 205-2) from the equilibration voltage $V_{DD}/2$ to the rail voltage $V_{DD}$.

The four sets of possible sense amplifier and accumulator signals illustrated in FIG. 5 (e.g., one for each combination of Row X and Row Y data values) shows the behavior of signals on data lines D and D_. The Row X data value is stored in the primary latch of the sense amp. It should be noted that FIG. 2A shows that the memory cell including storage element 203-2 and access transistor 202-2, corresponding to Row X, is coupled to the complementary data line D, while the memory cell including storage element 203-2 and access transistor 202-1, corresponding to Row Y, is coupled to data line D. However, as can be seen in FIG. 2A, the charge stored in the memory cell comprising access transistor 202-2 (corresponding to Row X) corresponding to a "0" data value causes the voltage on data line D_ (to which access transistor 202-2 is coupled) to go high and the charge stored in the memory cell comprising access transistor 202-2 corresponding to a "1" data value causes the voltage on data line D_ to go low, which is opposite correspondence between data states and charge stored in the memory cell corresponding to access transistor 202-1, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 5, causing load/pass transistors 218-1 and 218-2 to conduct. In this manner, activating the LOAD control signal enables the secondary latch in the accumulator of the compute component 231. The sensed data value stored in the sense amplifier 206 is transferred (e.g., copied) to the secondary latch. As shown for each of the four sets of possible sense amplifier and accumulator signals illustrated in FIG. 5, the behavior at inputs of the secondary latch of the accumulator indicates the secondary latch is loaded with the Row X data value. As shown in FIG. 5, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 205-1 and 205-2), in the pseudo code above, "Deactivate LOAD" indicates that the LOAD control signal goes back low as shown at is in FIG. 5 to cause the load/pass transistors 218-1 and 218-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 5, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 5 by the EQ signal going high at $t_7$. As shown in each of the four sets of possible sense amplifier and accumulator signals illustrated in FIG. 5 at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206 and the secondary latch of the compute component 231) and the second data value (stored in a memory cell 202-1 coupled to Row Y 204-Y) can include performing particular operations which depend on the whether an AND or an OR operation is to be performed. Examples of pseudo code associated with "ANDing" and "ORing" the data value residing in the accumulator (e.g., the first data value stored in the memory cell 202-2 coupled to Row X 204-X) and the second data value (e.g., the data value stored in the memory cell 202-1 coupled to Row Y 204-Y) are summarized below. Example pseudo code associated with "ANDing" the data values can include:

Deactivate EQ;
Open Row Y;
Fire Sense Amps (after which Row Y data resides in the sense amps);
Close Row Y;
  The result of the logic operation, in the next operation, will be placed on the sense amp, which will overwrite any row that is active;
  Even when Row Y is closed, the sense amplifier still contains the Row Y data value;
Activate AND;
  This results in the sense amplifier being written to the value of the function (e.g., Row X AND Row Y);
  If the accumulator contains a "0" (i.e., a voltage corresponding to a "0" on node S2 and a voltage corresponding to a "1" on node S1), the sense amplifier data is written to a "0";
  If the accumulator contains a "1" (i.e., a voltage corresponding to a "1" on node S2 and a voltage corresponding to a "0" on node S1), the sense amplifier data remains unchanged (Row Y data);
  This operation leaves the data in the accumulator unchanged; Deactivate AND;
Precharge;

In the pseudo code above, "Deactivate EQ" indicates that an equilibration signal corresponding to the sense amplifier 206 is disabled (e.g., such that the complementary data lines 205-1 and 205-2) are no longer shorted to $V_{DD}/2$), which is illustrated in FIG. 5 at $t_8$. After equilibration is disabled, a selected row (e.g., ROW Y) is enabled as indicated in the pseudo code above by "Open Row Y" and shown in FIG. 5 at $t_9$. When the voltage signal applied to ROW Y reaches the threshold voltage (Vt) of the access transistor (e.g., 202-1) corresponding to the selected cell, the access transistor turns on and couples the data line (e.g., 205-1) to the selected cell (e.g., to capacitor 203-1) which creates a differential voltage signal between the data lines.

After Row Y is enabled, in the pseudo code above, "Fire Sense Amps" indicates that the sense amplifier 206 is enabled to amplify the differential signal between 205-1 and 205-2), resulting in a voltage (e.g., $V_{DD}$) corresponding to a logic 1 or a voltage (e.g., GND) corresponding to a logic 0 being on data line 205-1 (and the voltage corresponding to the other logic state being on complementary data line 205-2). As shown at $t_{10}$ in FIG. 5, the ACT positive control signal (e.g., 265 shown in FIG. 2B) goes high and the RnIF negative control signal (e.g., 228 shown in FIG. 2B) goes low to fire the sense amps. The sensed data value from memory cell 202-1 is stored in the primary latch of sense amplifier 206, as previously described. The secondary latch still corresponds to the data value from memory cell 202-2 since the dynamic latch is unchanged.

After the second data value sensed from the memory cell 202-1 coupled to Row Y is stored in the primary latch of sense amplifier 206, in the pseudo code above, "Close Row Y" indicates that the selected row (e.g., ROW Y) can be disabled if it is not desired to store the result of the AND logical operation back in the memory cell corresponding to Row Y. However, FIG. 5 shows that Row Y is left enabled such that the result of the logical operation can be stored back in the memory cell corresponding to Row Y. Isolating the memory cell corresponding to Row Y can be accomplished by the access transistor turning off to decouple the selected cell 202-1 from the data line 205-1. After the selected Row Y is configured (e.g., to isolate the memory cell or not isolate the memory cell), "Activate AND" in the pseudo code above indicates that the AND control signal goes high as shown in FIG. 5 at $t_{11}$, causing pull down transistor 207-1 to conduct. In this manner, activating the AND control signal causes the value of the function (e.g., Row X AND Row Y) to be written to the sense amp.

With the first data value (e.g., Row X) stored in the dynamic latch of the accumulator 231 and the second data value (e.g., Row Y) stored in the sense amplifier 206, if the dynamic latch of the compute component 231 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 209-1 to conduct thereby coupling the sense amplifier 206 to ground through transistor 209-1, pull down transistor 207-1 and data line 205-1. When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 206. This operation leaves the data value in the accumulator unchanged (e.g., from Row X).

If the secondary latch of the accumulator contains a "1" (e.g., from Row X), then the result of the AND operation depends on the data value stored in the sense amplifier 206 (e.g., from Row Y). The result of the AND operation should be a "1" if the data value stored in the sense amplifier 206 (e.g., from Row Y) is also a "1," but the result of the AND operation should be a "0" if the data value stored in the sense amplifier 206 (e.g., from Row Y) is also a "0." The sensing circuitry 250 is configured such that if the dynamic latch of the accumulator contains a "1" (i.e., a voltage corresponding to a "1" on node S2 and a voltage corresponding to a "0" on node S1), transistor 209-1 does not conduct, the sense amplifier is not coupled to ground (as described above), and the data value previously stored in the sense amplifier 206 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 206, "Deactivate AND" in the pseudo code above indicates that the AND control signal goes low as shown at $t_{12}$ in FIG. 5, causing pull down transistor 207-1 to stop conducting to isolate the sense amplifier 206 (and data line 205-1) from ground. If not previously done, Row Y can be closed (as shown at $t_{13}$ in FIG. 5) and the sense amplifier can be disabled (as shown at $t_{14}$ in FIG. 5 by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 5).

FIG. 5 shows, in the alternative, the behavior of voltage signals on the data lines (e.g., 205-1 and 205-2 shown in FIG. 2A) coupled to the sense amplifier (e.g., 206 shown in FIG. 2A) and the behavior of voltage signals on nodes S1 and S2 of the secondary latch of the compute component (e.g., 231 shown in FIG. 2A) for an AND logical operation involving each of the possible combination of operands (e.g., Row X/Row Y data values 00, 10, 01, and 11).

Although the timing diagrams illustrated in FIG. 5 and the pseudo code described above indicate initiating the AND logical operation after starting to load the second operand (e.g., Row Y data value) into the sense amplifier, the circuit shown in FIG. 2A can be successfully operated by initiating the AND logical operation before starting to load the second operand (e.g., Row Y data value) into the sense amplifier.

Figure 6:
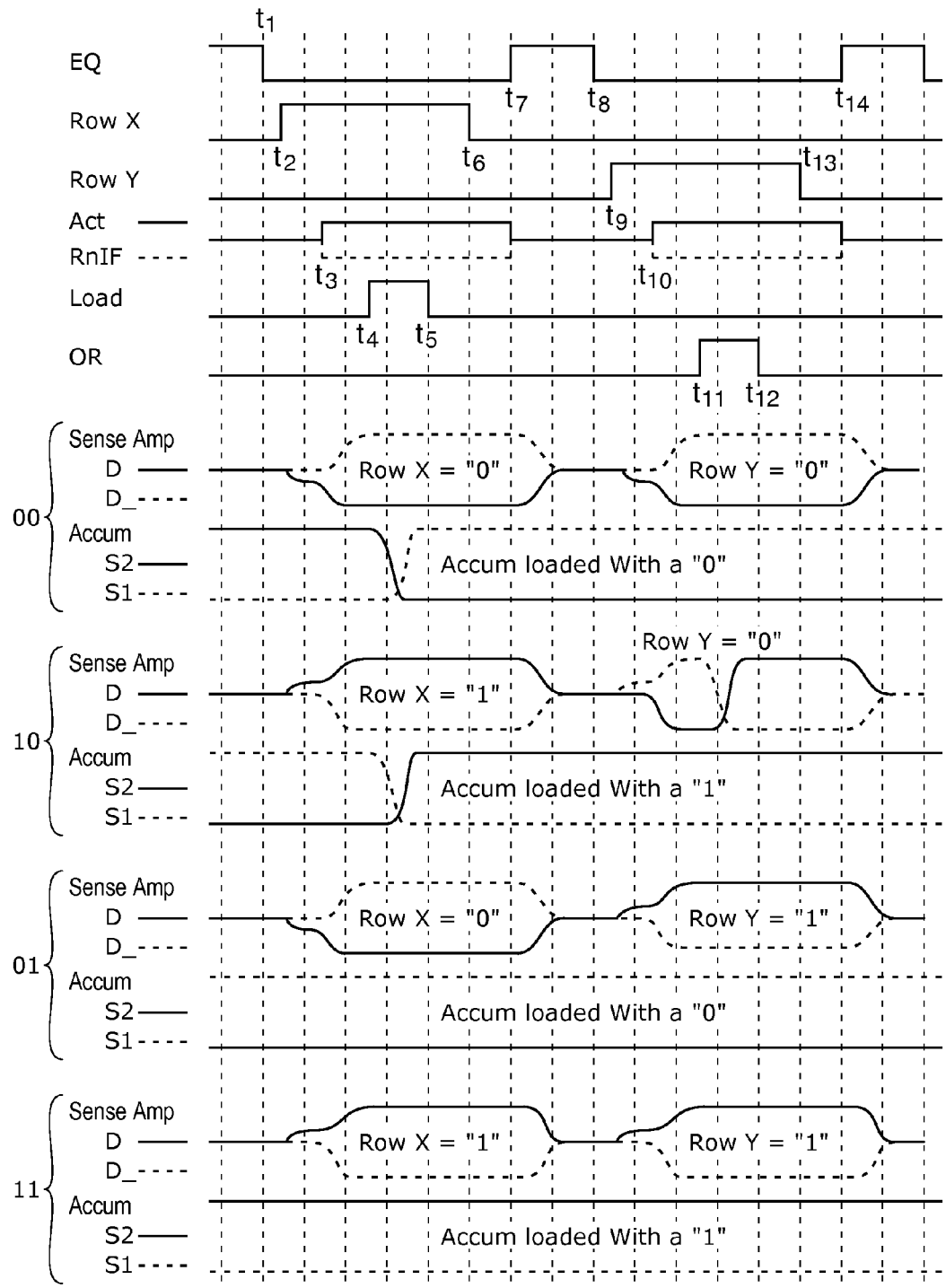
FIG. 6 illustrates a timing diagram associated with performing a number of logical operations using sensing circuitry in accordance with a number of embodiments of the present disclosure.

FIG. 6 illustrates a timing diagram associated with performing a number of logical operations using sensing circuitry in accordance with a number of embodiments of the present disclosure. FIG. 6 illustrates a timing diagram associated with initiating an OR logical operation after starting to load the second operand (e.g., Row Y data value) into the sense amplifier. FIG. 6 illustrates the sense amplifier and accumulator signals for various combinations of first and second operand data values. The particular timing diagram signals are discussed below with respect to the pseudo code associated with an AND logical operation of the circuit shown in FIG. 2A.

A subsequent operation phase can alternately be associated with performing the OR operation on the first data value (now stored in the sense amplifier 206 and the secondary latch of the compute component 231) and the second data value (stored in a memory cell 202-1 coupled to Row Y 204-Y). The operations to load the Row X data into the sense amplifier and accumulator that were previously described with respect to times $t_1$-$t_7$ shown in FIG. 5 are not repeated with respect to FIG. 6. Example pseudo code associated with "ORing" the data values can include:

Deactivate EQ;
Open Row Y;
Fire Sense Amps (after which Row Y data resides in the sense amps);
Close Row Y;
  When Row Y is closed, the sense amplifier still contains the Row Y data value;
Activate OR;
  This results in the sense amplifier being written to the value of the function (e.g., Row X OR Row Y), which may overwrite the data value from Row Y previously stored in the sense amplifier as follows:
  If the accumulator contains a "0" (i.e., a voltage corresponding to a "0" on node S2 and a voltage corresponding to a "1" on node S1), the sense amplifier data remains unchanged (Row Y data);
  If the accumulator contains a "1" (i.e., a voltage corresponding to a "1" on node S2 and a voltage corresponding to a "0" on node S1), the sense amplifier data is written to a "1";
  This operation leaves the data in the accumulator unchanged; Deactivate OR;
Precharge;

The "Deactivate EQ" (shown at is in FIG. 6), "Open Row Y" (shown at $t_9$ in FIG. 6), "Fire Sense Amps" (shown at $t_{10}$ in FIG. 6), and "Close Row Y" (shown at $t_{13}$ in FIG. 6, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 6, which causes pull down transistor 207-2 to conduct. In this manner, activating the OR control signal causes the value of the function (e.g., Row X OR Row Y) to be written to the sense amp.

With the first data value (e.g., Row X) stored in the secondary latch of the compute component 231 and the second data value (e.g., Row Y) stored in the sense amplifier 206, if the dynamic latch of the accumulator contains a "0" (i.e., a voltage corresponding to a "0" on node S2 and a voltage corresponding to a "1" on node S1), then the result of the OR operation depends on the data value stored in the sense amplifier 206 (e.g., from Row Y). The result of the OR operation should be a "1" if the data value stored in the sense amplifier 206 (e.g., from Row Y) is a "1," but the result of the OR operation should be a "0" if the data value stored in the sense amplifier 206 (e.g., from Row Y) is also a "0." The sensing circuitry 250 is configured such that if the dynamic latch of the accumulator contains a "0," with the voltage corresponding to a "0" on node S2, transistor 209-2 is off and does not conduct (and pull down transistor 207-1 is also off since the AND control signal is not asserted) so the sense amplifier 206 is not coupled to ground (either side), and the data value previously stored in the sense amplifier 206 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 209-2 does conduct (as does pull down transistor 207-2 since the OR control signal is asserted), and the sense amplifier 206 input coupled to data line 205-2 is coupled to ground since the voltage corresponding to a "1" on node S2 causes transistor 209-2 to conduct along with pull down transistor 207-2 (which also conducts since the OR control signal is asserted). In this manner, a "1" is initially stored in the sense amplifier 206 as a result of the OR operation when the secondary latch of the accumulator contains a "1" regardless of the data value previously stored in the sense amp. This operation leaves the data in the accumulator unchanged. FIG. 6 shows, in the alternative, the behavior of voltage signals on the data lines (e.g., 205-1 and 205-2 shown in FIG. 2A) coupled to the sense amplifier (e.g., 206 shown in FIG. 2A) and the behavior of voltage signals on nodes S1 and S2 of the secondary latch of the compute component 231 for an OR logical operation involving each of the possible combination of operands (e.g., Row X/Row Y data values 00, 10, 01, and 11).

After the result of the OR operation is initially stored in the sense amplifier 206, "Deactivate OR" in the pseudo code above indicates that the OR control signal goes low as shown at $t_{12}$ in FIG. 6, causing pull down transistor 207-2 to stop conducting to isolate the sense amplifier 206 (and data line D 205-2) from ground. If not previously done, Row Y can be closed (as shown at $t_{13}$ in FIG. 6) and the sense amplifier can be disabled (as shown at $t_{14}$ in FIG. 6 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 6.

The sensing circuitry 250 illustrated in FIG. 2A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 214-1 to conduct and activating the ANDinv control signal causes transistor 214-2 to conduct. In each case, asserting the appropriate inverted control signal can flip the sense amplifier and cause the result initially stored in the sense amplifier 206 to be that of the AND operation using inverted Row X and true Row Y data values or that of the OR operation using the inverted Row X and true Row Y data values. A true or complement version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2A can perform a NOT (e.g., invert) operation by putting the non-inverted data value into the dynamic latch of the accumulator and using that data to invert the data value in the sense amplifier 206. As previously mentioned, activating the ORinv control signal causes transistor 214-1 to conduct and activating the ANDinv control signal causes transistor 214-2 to conduct. The ORinv and/or ANDinv control signals are used in implementing the NOT function, as described further below:

Copy Row X into the Accumulator;
  Deactivate EQ;
  Open Row X;
  Fire Sense Amps (after which Row X data resides in the sense amps);
  Activate LOAD (sense amplifier data (Row X) is transferred to nodes S1 and S2 of the Accumulator and resides there dynamically;
  Deactivate LOAD;
  Activate ANDinv and ORinv (which puts the compliment data value on the data lines);
    This results in the data value in the sense amplifier being inverted (e.g., the sense amplifier latch is flipped);
  This operation leaves the data in the accumulator unchanged Deactivate ANDinv and ORinv;
  Close Row X;
  Precharge;

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and Precharging after the Row X data is loaded into the sense amplifier 206 and copied into the dynamic latch, a complement version of the data value in the dynamic latch of the accumulator can be placed on the data line and thus transferred to the sense amplifier 206 by enabling (e.g., causing transistor to conduct) and disabling the invert transistors (e.g., ANDinv and ORinv). This results in the sense amplifier 206 being flipped from the true data value that was previously stored in the sense amplifier to a complement data value (e.g., inverted data value) stored in the sense amp. For instance, a true or complement version of the data value in the accumulator can be transferred to the sense amplifier by activating and deactivating ANDinv and ORinv. This operation leaves the data in the accumulator unchanged.

Because the sensing circuitry 250 shown in FIG. 2A initially stores the result of the AND, OR, and NOT logical operations in the sense amplifier 206 (e.g., on the sense amplifier nodes), these logical operation results can be communicated easily and quickly to any enabled row, any row activated after the logical operation is complete, and/or into the secondary latch of the compute component 231. The sense amplifier 206 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 206 fires.

When performing logical operations in this manner, the sense amplifier 206 can be pre-seeded with a data value from the dynamic latch of the accumulator to reduce overall current utilized because the sense amps 206 are not at full rail voltages (e.g., supply voltage or ground/reference voltage) when accumulator function is copied to the sense amplifier 206. An operation sequence with a pre-seeded sense amplifier 206 either forces one of the data lines to the reference voltage (leaving the complementary data line at $V_{DD}/2$, or leaves the complementary data lines unchanged. The sense amplifier 206 pulls the respective data lines to full rails when the sense amplifier 206 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 223 can be used for shifting data values stored in memory cells coupled to a particular pair of complementary data lines to the sensing circuitry 250 (e.g., sense amplifier 206) corresponding to a different pair of complementary data lines (e.g., such as a sense amplifier 206 corresponding to a left or right adjacent pair of complementary data lines. As used herein, a sense amplifier 206 corresponds to the pair of complementary data lines to which the sense amplifier is coupled when isolation transistors 221-1 and 221-2 are conducting. The SHIFT operations (right or left) do not pre-copy the Row X data value into the accumulator. Operations to shift right Row X can be summarized as follows:

Deactivate Norm and Activate Shift;
  Deactivate EQ;

Open Row X;
Fire Sense Amps (after which shifted Row X data resides in the sense amps);
Activate Norm and Deactivate Shift;
Close Row X;
Precharge;

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 206.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and the SHIFT control signal goes low causing isolation transistors 221-3 and 221-4 to not conduct and isolating the sense amplifier 206 from the left adjacent pair of complementary data lines (e.g., on the memory array side of non-conducting isolation transistors 221-1 and 221-2 for the left adjacent pair of complementary data lines). Since Row X is still active, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above. Operations to shift left Row X can be summarized as follows:

Activate Norm and Deactivate Shift;
Deactivate EQ;
Open Row X;
Fire Sense Amps (after which Row X data resides in the sense amps);
Deactivate Norm and Activate Shift;
Sense amplifier data (shifted left Row X) is transferred to Row X;
Close Row X;
Precharge;

In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 250 is stored in the sense amplifier 206.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at $6F^2$ or $4F^2$ memory cell sizes, for example. A potential advantage of the apparatuses and methods described herein may not be realized in terms of single instruction speed, but rather can be realized in the cumulative speed that can be achieved by an entire bank of data being computed in parallel without necessarily transferring data out of the memory array (e.g., DRAM) or firing a column decode. In other words, data transfer time can be reduced or eliminated. For example, apparatuses of the present disclosure can perform ANDs or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred therebetween. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

Figure 7:
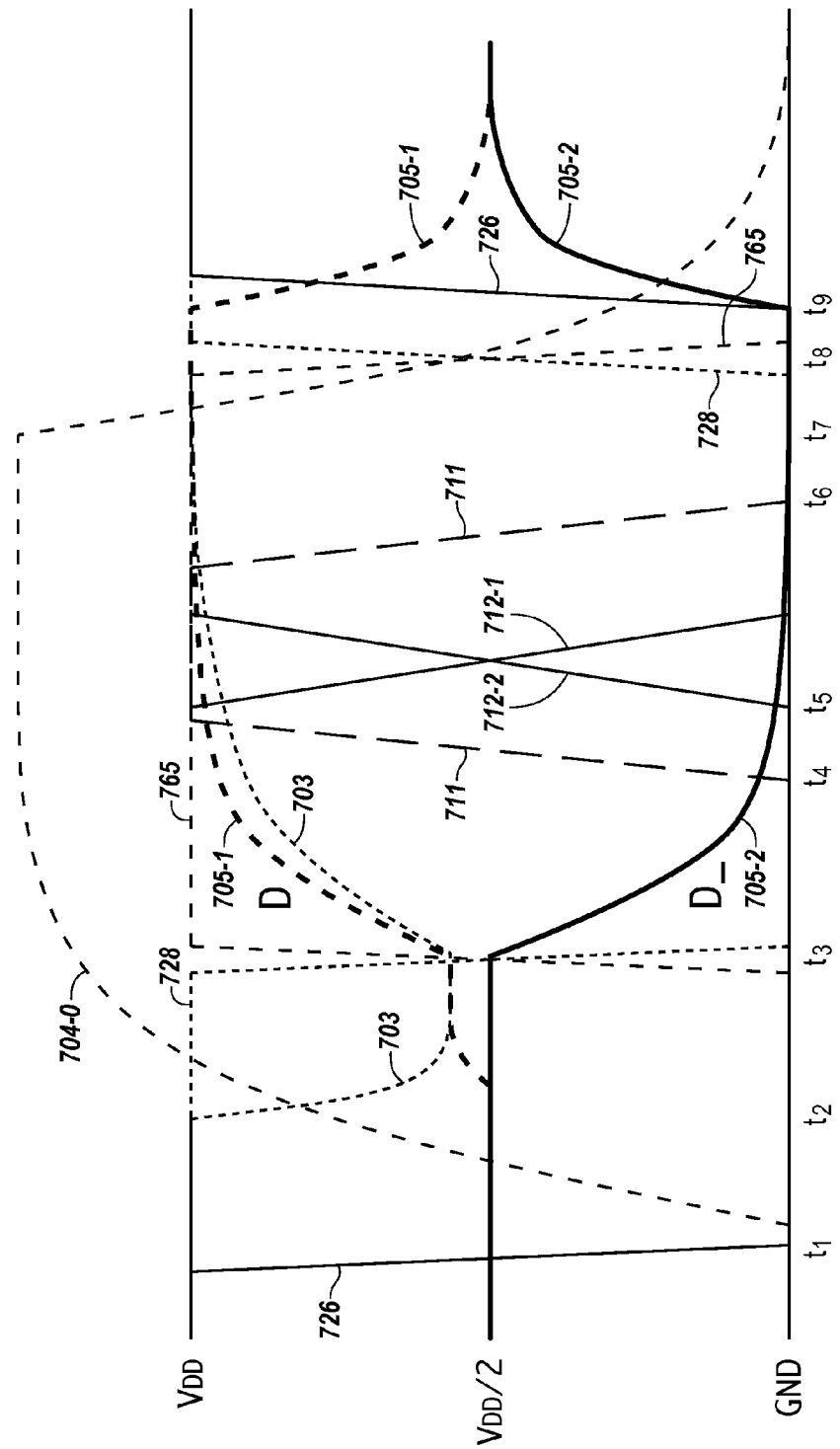
FIG. 7 illustrates a timing diagram associated with performing a number of logical operations using sensing circuitry in accordance with a number of embodiments of the present disclosure.

FIG. 7 illustrates a timing diagram associated with performing a number of logical operations using sensing circuitry in accordance with a number of embodiments of the present disclosure. The functionality of the sensing circuitry 250 of FIG. 2A is described below with respect to performing logical operations and initially storing a result in the compute component 231 (e.g., secondary latch of the accumulator). The timing diagram shown in FIG. 7 illustrates signals (e.g., voltage signals) associated with performing a first operation phase of a logical operation (e.g., an R-input logical operation) using the sensing circuitry illustrated in FIG. 2A. The first operation phase described with respect to FIG. 7 can be a first operation phase of an AND, NAND, OR, or NOR operation, for instance. Performing the operation phase illustrated in FIG. 7 can involve consuming significantly less energy (e.g., about half) than previous processing approaches that may involve providing a full swing between voltage rails (e.g., between a supply and ground).

In the example illustrated in FIG. 7, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 7 do not necessarily represent a same absolute or relative time as similar time references in other timing diagrams.

t time $t_1$, the equilibration signal 726 is deactivated, and then a selected row is enabled (e.g., the row corresponding to a memory cell whose data value is to be sensed and used as a first input). Signal 704-0 represents the voltage signal applied to the selected row (e.g., Row Y 204-Y shown in FIG. 2A). When row signal 704-0 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 shown in FIG. 2A if the cell is a 1T1C DRAM cell), which creates a differential voltage signal between the data lines D and D_ (e.g., as indicated by signals 705-1 and 705-2 on the data lines, respectively) between times $t_2$ and $t_3$. The voltage of the selected cell is represented by signal 703. Due to conservation of energy, creating the differential signal between data lines D and D_ (e.g., by coupling the cell to data line D) does not consume energy, since the energy associated with enabling/disabling the row signal 704-0 can be amortized over the plurality of memory cells coupled to the row.

At time $t_3$, the sense amplifier (e.g., 206 shown in FIG. 2A) is activated (e.g., a positive control signal 765 (e.g., corresponding to ACT 265 shown in FIG. 2B) goes high and the negative control signal 728 (e.g., corresponding to RnIF 228 shown in FIG. 2B) goes low), which amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line D_), such that the sensed data value is stored in the primary latch of sense amplifier 206. The primary energy consumption occurs in charging the data line D (205-1) from the equilibration voltage $V_{DD}/2$ to the rail voltage $V_{DD}$. FIG. 7 shows, in example, the data line voltages 705-1 and 705-2 that correspond to a logic "1" being on data line D.

According to some embodiments, the primary latch of sense amplifier 206 can be coupled to the complementary data lines D and D_ through respective pass transistors (not shown in FIG. 2B but in a similar configuration as the manner in which latch 264 is coupled to the data lines D and D_ through load/pass transistors 218-1 and 218-2 shown in FIG. 2A). The Passd control signal 711 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 711 applied to control lines coupled to the respective gates of the pass transistors going high). At time $t_5$, the accumulator positive control signal 712-1 (e.g., Accumb) and the accumulator positive control signal 712-2 (e.g., Accum) are activated via respective control lines 212-1 and 212-2 shown in FIG. 2A. As described below, the accumulator control signals ACCUMB 712-1 and ACCUM 712-2 may remain activated for subsequent operation phases. As such, in this example, activating the control signals ACCUMB 712-1 and ACCUM 712-2 enables the secondary latch (e.g., accumulator) of compute component 231-6 shown in FIG. 2A. The sensed data value stored in sense amplifier 206 is transferred (e.g., copied) to the secondary latch, including the dynamic latch and latch 264.

At time $t_6$, the Passd control signal 711 (and the Passdb control signal) goes low thereby turning off the pass transistors (if present). However, since the accumulator control signals ACCUMB 712-1 and ACCUM 712-2 remain activated, an accumulated result is stored (e.g., latched) in the secondary latches (e.g., accumulator). At time $t_7$, the row signal 704-0 is deactivated, and the array sense amps are disabled at time is (e.g., sense amplifier control signals 728 and 765 are deactivated).

At time $t_9$, the data lines D and D_ are equilibrated (e.g., equilibration signal 726 is activated), as illustrated by data line voltage signals 705-1 and 705-2 moving from their respective rail values to the equilibration voltage ($V_{DD}/2$). The equilibration consumes little energy due to the law of conservation of energy. As described below in association with FIG. 2B, equilibration can involve shorting the complementary data lines D and D_ together at an equilibration voltage, which is $V_{DD}/2$, in this example. Equilibration can occur, for instance, prior to a memory cell sensing operation.

Figure 8:
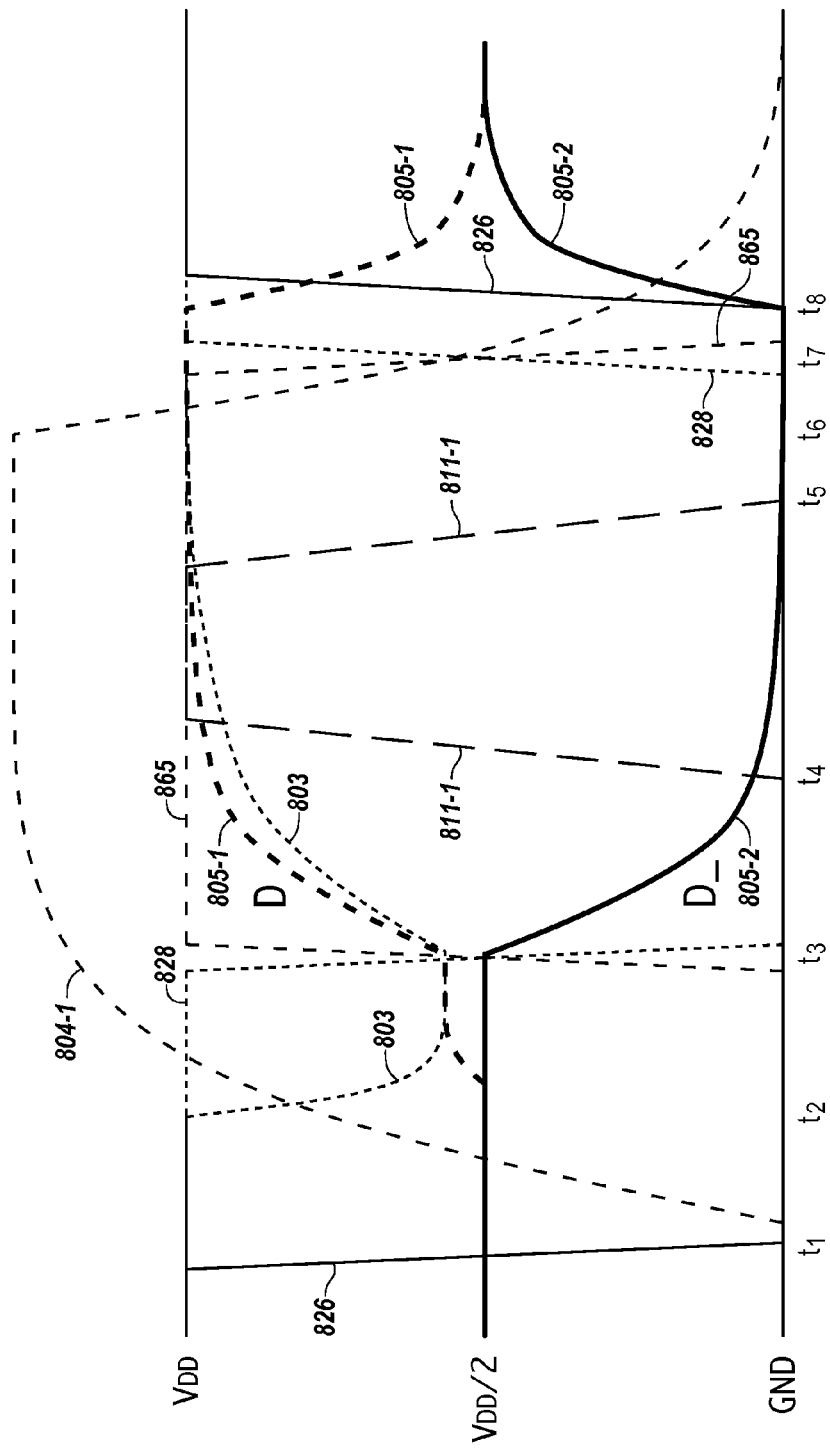
FIG. 8 illustrates a timing diagram associated with performing a number of logical operations using sensing circuitry in accordance with a number of embodiments of the present disclosure.
Figure 9:
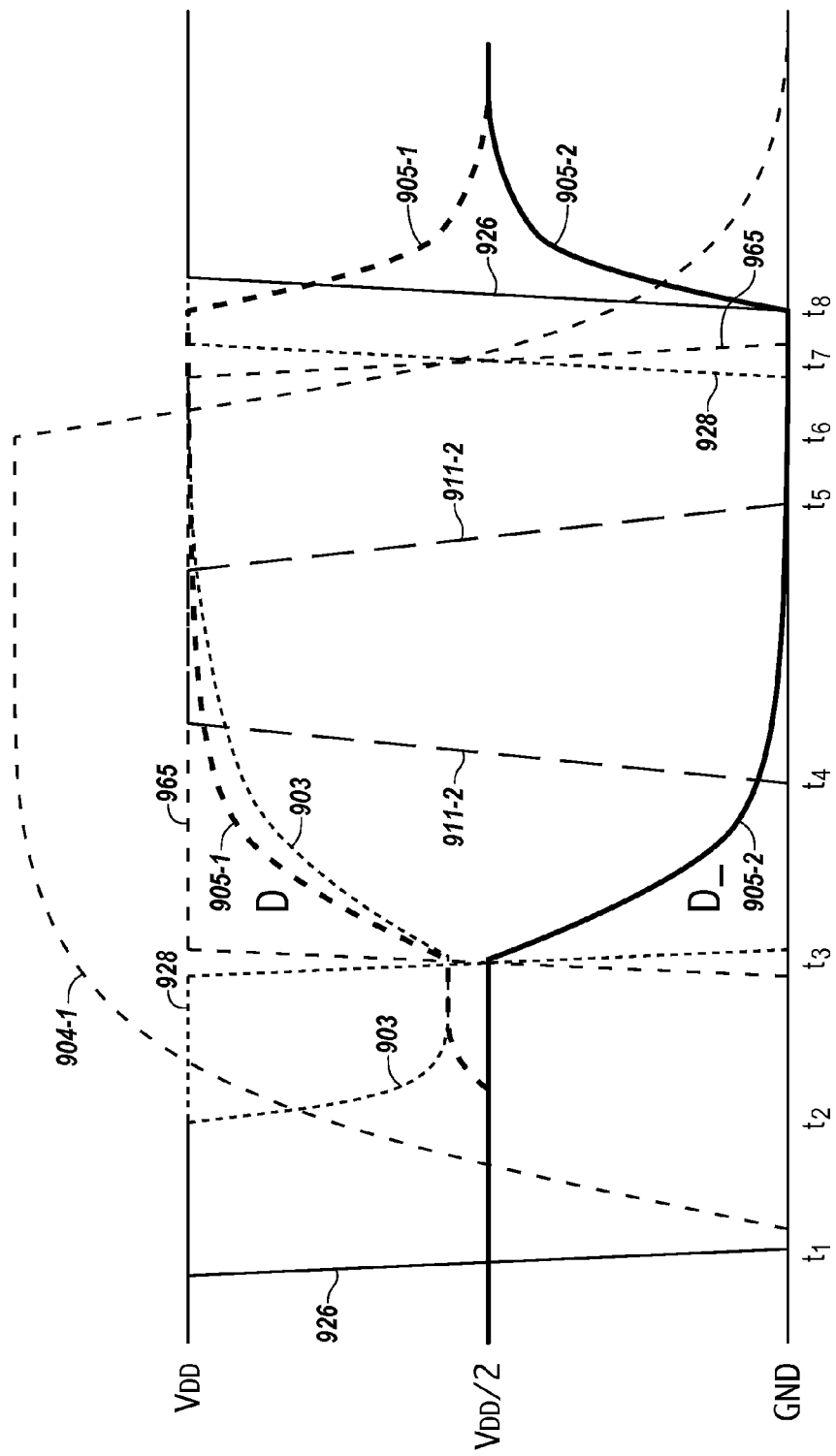
FIG. 9 illustrate a timing diagram associated with performing a number of logical operations using sensing circuitry in accordance with a number of embodiments of the present disclosure.

FIGS. 8 and 9 respectively illustrate timing diagrams associated with performing a number of logical operations using sensing circuitry in accordance with a number of embodiments of the present disclosure. Timing diagrams shown in FIGS. 8 and 9 illustrate signals (e.g., voltage signals) associated with performing a number of intermediate operation phases of a logical operation (e.g., an R-input logical operation). For instance, timing diagram shown in FIG. 8 corresponds to a number of intermediate operation phases of an R-input NAND operation or an R-input AND operation, and timing diagram shown in FIG. 9 corresponds to a number of intermediate operation phases of an R-input NOR operation or an R-input OR operation. For example, performing an AND or NAND operation can include performing the operation phase shown in FIG. 8 one or more times subsequent to an initial operation phase such as that described with respect to FIG. 7. Similarly, performing an OR or NOR operation can include performing the operation phase shown and described with respect to FIG. 9 one or more times subsequent to an initial operation phase such as that described with respect to FIG. 7.

As shown in the timing diagrams illustrated in FIGS. 8 and 9, at time $t_1$, equilibration is disabled (e.g., the equilibration signal 826/926 is deactivated), and then a selected row is enabled (e.g., the row corresponding to a memory cell whose data value is to be sensed and used as an input such as a second input, third input, etc.). Signal 804-1/904-1 represents the voltage signal applied to the selected row (e.g., Row Y 204-Y shown in FIG. 2A). When row signal 804-1 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 if the cell is a 1T1C DRAM cell), which creates a differential voltage signal between the data lines D and D_ (e.g., as indicated by signals 805-1/905-1 and 805-2/905-2, respectively) between times $t_2$ and $t_3$. The voltage of the selected cell is represented by signal 803/903. Due to conservation of energy, creating the differential signal between D and D_ (e.g., by coupling the cell to data line D) does not consume energy, since the energy associated with activating/deactivating the row signal 804-1/904-1 can be amortized over the plurality of memory cells coupled to the row.

At time $t_3$, the sense amplifier (e.g., 206 shown in FIG. 2A) is enabled (e.g., a positive control signal 865/965 (e.g., corresponding to ACT 233 shown in FIG. 2B) goes high, and the negative control signal 828/928 (e.g., RnIF 228 shown in FIG. 2B) goes low), which amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line D_), such that the sensed data value is stored in the primary latch of sense amplifier 206. The primary energy consumption occurs in charging the data line 205-1 from the equilibration voltage $V_{DD}/2$ to the rail voltage $V_{DD}$.

As shown in timing diagrams illustrated in FIGS. 8 and 9, at time $t_4$ (e.g., after the selected cell is sensed), only one of control signals 811-1 (Passd) shown in FIGS. 8 and 911-2 (Passdb) shown in FIG. 9 is activated (e.g., only one of pass transistors (if present) is enabled), depending on the particular logic operation. For example, since the timing diagram illustrated in FIG. 8 corresponds to an intermediate phase of a NAND or AND operation, control signal 811-1 (Passd) is activated at time t4 to turn on the pass transistor coupling the primary latch to data line D and the Passdb control signal remains deactivated leaving the pass transistor coupling the primary latch to data line D_ turned off. Conversely, since the timing diagram illustrated in FIG. 9 corresponds to an intermediate phase of a NOR or OR operation, control signal 911-2 (Passdb) is activated at time t4 to turn on the pass transistor coupling the primary latch to data line D_ and control signal Passd remains deactivated leaving the pass transistor coupling the primary latch to data line D turned off. Recall from above that the accumulator control signals 712-1 (Accumb) and 712-2 (Accum) were activated during the initial operation phase described with respect to FIG. 7, and they remain activated during the intermediate operation phase(s).

Since the accumulator was previously enabled, activating only Passd (811-1 as shown in FIG. 8) results in accumulating the data value corresponding to the voltage signal 805-1 shown in FIG. 8 corresponding to data line D. Similarly, activating only Passdb (911-2 as shown in FIG. 9) results in accumulating the data value corresponding to the voltage signal 905-2 corresponding to data line D_. For instance, in an example AND/NAND operation shown in the timing diagram illustrated in FIG. 8 in which only Passd (811-1) is activated, if the data value stored in the second selected memory cell is a logic "0," then the accumulated value associated with the secondary latch is asserted low such that the secondary latch stores logic "0." If the data value stored in the second selected memory cell is not a logic"0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 9 in which only Passdb 911-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 905-2 on D_ is setting the true data value of the accumulator.

At the conclusion of an intermediate operation phase such as that shown in FIG. 8 or 9, the Passd signal 811-1 (e.g., for AND/NAND) or the Passdb signal 911-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 8 or 9 can be repeated in order to accumulate results from a number of additional rows. As an example, the sequence of timing diagram illustrated in FIGS. 8 and/or 9 can be performed a subsequent (e.g., second) time for a third memory cell, a subsequent (e.g., third) time for a fourth memory cell, etc. For instance, for a 10-input NOR operation, the intermediate phase shown in FIG. 9 can occur 9 times to provide 9 inputs of the 10-input logical operation, with the tenth input being determined during the initial operation phase (e.g., as described with respect to FIG. 7).

Figure 10:
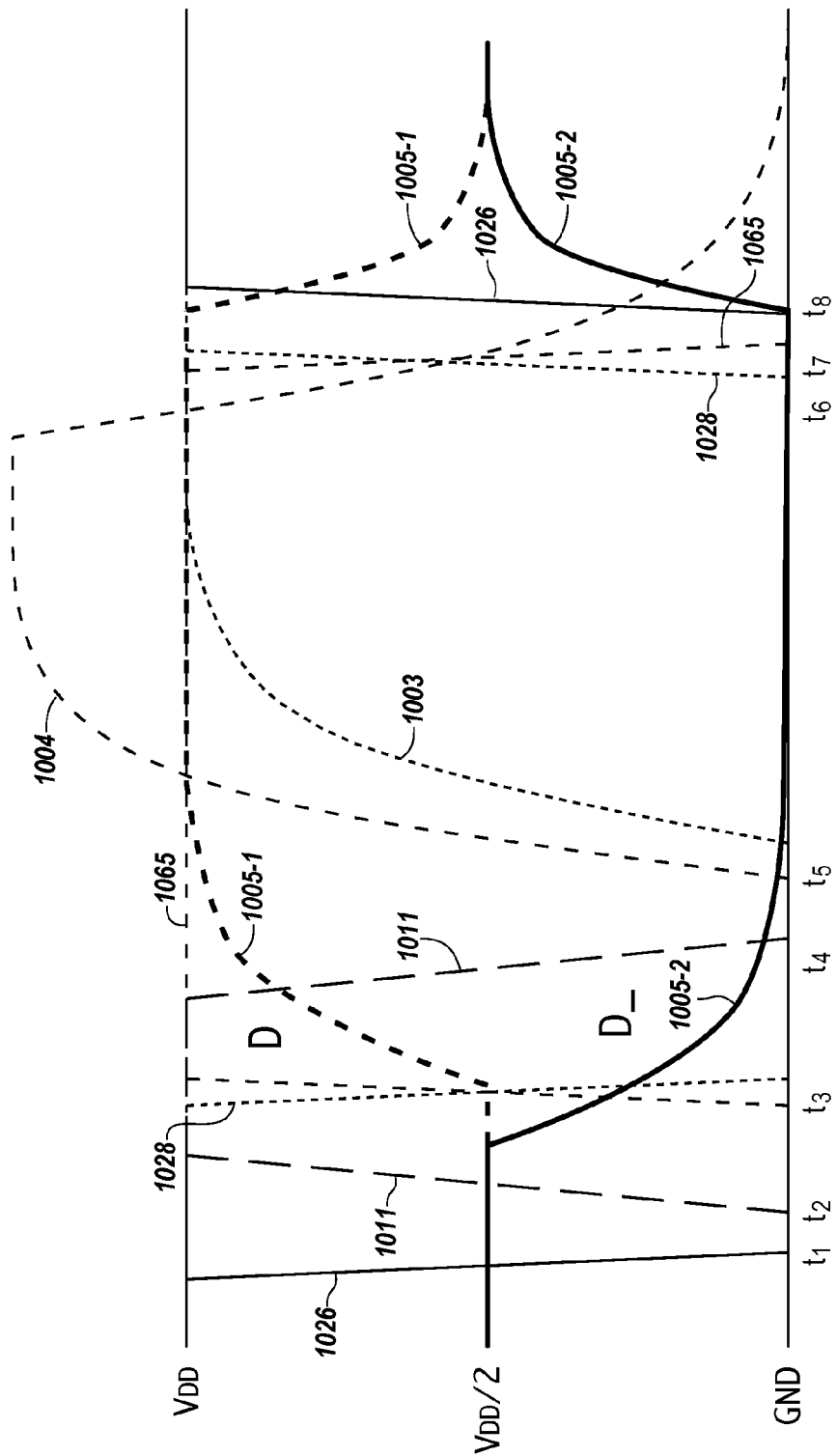
FIG. 10 illustrates a timing diagram associated with performing a number of logical operations using sensing circuitry in accordance with a number of embodiments of the present disclosure.

FIG. 10 illustrates a timing diagram associated with performing a number of logical operations using sensing circuitry in accordance with a number of embodiments of the present disclosure. The timing diagram illustrated in FIG. 10 shows signals (e.g., voltage signals) associated with performing a last operation phase of a logical operation (e.g., an R-input logical operation). For instance, the timing diagram illustrated in FIG. 10 corresponds to a last operation phase of an R-input AND operation or an R-input OR operation.

For example, performing a last operation phase of an R-input can include performing the operation phase shown in FIG. 10 subsequent to a number of iterations of the intermediate operation phase(s) described in association with FIGS. 8 and/or 9. Table 2 shown below indicates the Figures corresponding to the sequence of operation phases associated with performing a number of R-input logical operations in accordance with a number of embodiments described herein.

TABLE 2

| Operation | FIG. 7 | FIG. 8 | FIG. 9 | FIG. 10 |
| --- | --- | --- | --- | --- |
| AND | First phase | R-1 iterations | | Last phase |

TABLE 2-continued

| Operation | FIG. 7 | FIG. 8 | FIG. 9 | FIG. 10 |
|---|---|---|---|---|
| NAND | First phase | R-1 iterations | | |
| OR | First phase | | R-1 iterations | Last phase |
| NOR | First phase | | R-1 iterations | |

A NAND operation can be implemented, for example, by storing the result of the R-1 iterations for an AND operation in the sense amplifier, then inverting the sense amplifier before conducting the last operation phase to store the result (described below). A NOR operation can be implemented, for example, by storing the result of the R-1 iterations for an OR operation in the sense amplifier, then inverting the sense amplifier before conducting the last operation phase to store the result (described below).

The last operation phase illustrated in the timing diagram of FIG. 10 is described in association with storing a result of an R-input logical operation to a row of the array (e.g., array 230 shown in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 10, at time $t_1$, equilibration is disabled (e.g., the equilibration signal 1026 is deactivated) such that data lines D and D_ are floating. At time t2, the Passd control signal 1011 (and Passdb signal) is activated for an AND or OR operation.

Activating the Passd control signal 1011 (and Passdb signal) (e.g., in association with an AND or OR operation) transfers the accumulated output stored in the secondary latch of compute component 231-6 shown in FIG. 2A to the primary latch of sense amplifier 206. For instance, for an AND operation, if any of the memory cells sensed in the prior operation phases (e.g., the first operation phase illustrated in FIG. 7 and one or more iterations of the intermediate operation phase illustrated in FIG. 8) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 206 is then enabled (e.g., a positive control signal 1065 (e.g., corresponding to ACT 265 shown in FIG. 2B) goes high and the negative control signal 1028 (e.g., corresponding to RnIF 228 shown in FIG. 2B) goes low), which amplifies the differential signal between data lines D and D such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 7 and one or more iterations of the intermediate operation phase shown in FIG. 9) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 206 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 230 shown in FIG. 2A. In the examples shown in FIG. 10, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 10 shows, at time t7, the positive control signal 1065 and the negative control signal 1028 being deactivated (e.g., signal 1065 goes low and signal 1028 goes high) to disable the sense amplifier 206 shown in FIG. 2A. At time t4 the Passd control signal 1011 (and Passdb signal) that was activated at time t2 is deactivated. Embodiments are not limited to this example. For instance, in a number of embodiments, the sense amplifier 206 shown in FIG. 2A may be enabled subsequent to time t4 (e.g., after the Passd control signal 1011 (and Passdb signal) are deactivated).

As shown in FIG. 10, at time t5, a selected row is enabled (e.g., by row activation signal 1004 going high, which drives the capacitor of the selected cell to the voltage corresponding to the logic value stored in the accumulator. At time t6 the selected row is disabled. At time t7 the sense amplifier 206 shown in FIG. 2A is disabled (e.g., positive control signal 1028 and negative control signal 1065 are deactivated), and at time t8 equilibration occurs (e.g., signal 1026 is activated and the voltages on the complementary data lines 1005-1 (D) and 1005-2 (D_) are brought to the equilibration voltage).

Although the example of performing a last operation phase of an R-input was discussed above with respect to FIG. 10 for performing AND and OR logical operations, embodiments are not limited to these logical operations. For example, the NAND and NOR operations can also involve a last operation phase of an R-input that is stored back to a memory cell of array 230 using control signals to operate the sensing circuitry illustrated in FIG. 2A.

Figure 11:
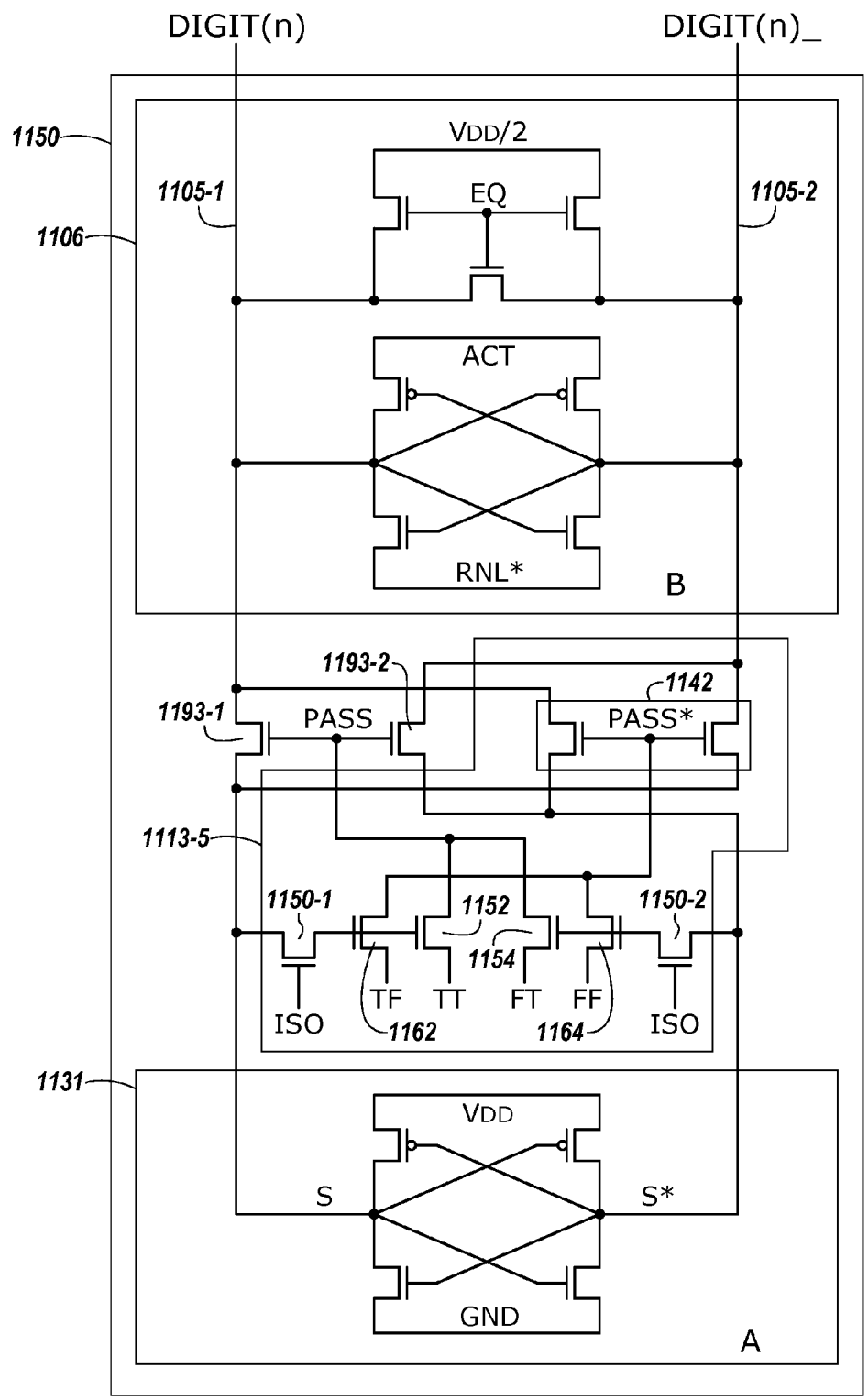
FIG. 11 is a schematic diagram illustrating sensing circuitry having selectable logical operation selection logic in accordance with a number of embodiments of the present disclosure.

FIG. 11 is a schematic diagram illustrating sensing circuitry having selectable logical operation selection logic in accordance with a number of embodiments of the present disclosure. FIG. 11 shows a sense amplifier 1106 coupled to a pair of complementary sense lines 1105-1 and 1105-2, and a compute component 1131 coupled to the sense amplifier 1106 via pass gates 1193-1 and 1193-2. The gates of the pass gates 1193-1 and 1193-2 can be controlled by a logical operation selection logic signal, PASS, which can be output from logical operation selection logic 1113-5. FIG. 11 shows the compute component 1131 labeled "A" and the sense amplifier 1106 labeled "B" to indicate that the data value stored in the compute component 1131 is the "A" data value and the data value stored in the sense amplifier 1106 is the "B" data value shown in the logic tables illustrated with respect to FIG. 12.

The sensing circuitry 1150 illustrated in FIG. 11 includes logical operation selection logic 1113-5. In this example, the logic 1113-5 comprises swap gates 1142 controlled by a logical operation selection logic signal PASS*. The logical operation selection logic 1113-5 also comprises four logic selection transistors: logic selection transistor 1162 coupled between the gates of the swap transistors 1142 and a TF signal control line, logic selection transistor 1152 coupled between the gates of the pass gates 1193-1 and 1193-2 and a TT signal control line, logic selection transistor 1154 coupled between the gates of the pass gates 1193-1 and 1193-2 and a FT signal control line, and logic selection transistor 1164 coupled between the gates of the swap transistors 1142 and a FF signal control line. Gates of logic selection transistors 1162 and 1152 are coupled to the true sense line (e.g., 1105-1) through isolation transistor 1150-1 (having a gate coupled to an ISO signal control line), and gates of logic selection transistors 1164 and 1154 are coupled to the complementary sense line (e.g., 1105-2) through isolation transistor 1150-2 (also having a gate coupled to an ISO signal control line).

Logic selection transistors 1152 and 1154 are arranged similarly to transistor 507-1 (coupled to an AND signal control line) and transistor 507-2 (coupled to an OR signal control line) respectively, as shown in FIG. 5. Operation of logic selection transistors 1152 and 1154 are similar based on the state of the TT and FT selection signals and the data values on the respective complementary sense lines at the time the ISO signal is asserted. Logic selection transistors 1162 and 1164 also operate in a similar manner to control (e.g., enable by turning on or disable by turning off) the swap transistors 1142. For instance, to enable (e.g., turn on) the swap transistors 1142, either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 1142 will not be enabled by a particular logic selection transistor.

The PASS* control signal is not necessarily complementary to the PASS control signal. For instance, it is possible for the PASS and PASS* control signals to both be activated or both be deactivated at the same time. However, activation of both the PASS and PASS* control signals at the same time shorts the pair of complementary sense lines DIGIT(n)/DIGIT(n)_ together, which may be a disruptive configuration to be avoided. Logical operations results for the sensing circuitry illustrated in FIG. 11 are summarized in the logic table illustrated in FIG. 12.

Figure 12:
FIG. 12 is a logic table illustrating selectable logic operation results implemented by a sensing circuitry in accordance with a number of embodiments of the present disclosure.

FIG. 12 is a logic table illustrating selectable logic operation results implementable by the sensing circuitry shown in FIG. 11 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 1106 and compute component 1131. The four control signals (e.g., TF, TT, FT, and FF), in conjunction with a particular data value present on the complementary sense lines, controls the pass gates 1193-1 and 1193-2 and swap transistors 1142, which in turn affects the data value in the compute component 1131 and/or sense amplifier 1106 before/after firing. The capability to selectably control the swap transistors 1142 facilitates implementing logical operations involving inverse data values (e.g., inverse operands and/or inverse result), among others.

The logic table illustrated in FIG. 12 shows the starting data value stored in the compute component 1131 shown in column A at 1244, and the starting data value stored in the sense amplifier 1106 shown in column B at 1245. The other 3 top column headings (NOT OPEN 1256, OPEN TRUE 1270, and OPEN INVERT 1271) in the logic table of FIG. 12 refer to the state of the pass gates 1193-1 and 1193-2, and the swap transistors 1142, which can respectively be controlled to be OPEN or CLOSED depending on the state of the four logic selection control signals (e.g., TF, TT, FT, and FF), in conjunction with a particular data value present on the pair of complementary sense lines 1105-1 and 1105-2 when the ISO control signal is asserted. The "Not Open" column corresponds to the pass gates 1193-1 and 1193-2 and the swap transistors 1142 both being in a non-conducting (e.g., off) condition, the "Open True" corresponds to the pass gates 1193-1 and 1193-2 being in a conducting (e.g., on) condition, and the "Open Invert" corresponds to the swap transistors 1142 being in a conducting condition. The configuration corresponding to the pass gates 1193-1 and 1193-2 and the swap transistors 1142 both being in a conducting condition is not reflected in the logic table of FIG. 12 since this results in the sense lines being shorted together.

Via selective control of the pass gates 1193-1 and 1193-2 and the swap transistors 1142, each of the three columns of the first set of two rows of the upper portion of the logic table of FIG. 12 can be combined with each of the three columns of the second set of two rows below the first set to provide 3×3=9 different result combinations, corresponding to nine different logical operations, as indicated by the various connecting paths shown at 1275. The nine different selectable logical operations that can be implemented by the sensing circuitry 1150 are summarized in the logic table illustrated in FIG. 12.

The columns of the lower portion of the logic table illustrated in FIG. 12 show a heading 1280 that includes the state of logic selection control signals. For example, the state of a first logic selection control signal (e.g., FF) is provided in row 1276, the state of a second logic selection control signal (e.g., FT) is provided in row 1277, the state of a third logic selection control signal (e.g., TF) is provided in row 1278, and the state of a fourth logic selection control signal (e.g., TT) is provided in row 1279. The particular logical operation corresponding to the results is summarized in row 1247.

As such, the sensing circuitry shown in FIG. 11 can be used to perform various logical operations as shown in FIG. 12. For example, the sensing circuitry 1150 can be operated to perform various logical operations (e.g., AND and OR logical operations) in association with performing comparison operations in accordance with a number of embodiments of the present disclosure.

The present disclosure includes apparatuses and methods related to performing comparison operations in memory. An example apparatus can include a first group of memory cells coupled to a first access line and configured to store a plurality of first elements, and a second group of memory cells coupled to a second access line and configured to store a plurality of second elements. The apparatus can include a controller configured to cause the plurality of first elements to be compared with the plurality of second elements by controlling sensing circuitry to perform a number of operations without transferring data via an input/output (I/O) line, and the plurality of first elements and the plurality of second elements can be compared in parallel.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus comprising:
   a first group of memory cells coupled to a first access line and configured to store a plurality of elements, the elements in the first group comprising a first element having a first bit length and a second element having a second bit length that is different from the first bit length;
   a second group of memory cells coupled to a second access line and configured to store a plurality of elements, the elements in the second group comprising a first element having a first bit length and a second element having a second bit length that is different from the first bit length;
   wherein the first element in the first group has a bit length that is the same as the bit length of the first element in the second group and the second element in the first group has a bit length that is the same as the bit length of the second element in the second group;
   wherein the first element in the first group and the first element in the second group comprise a first element pair; and
   wherein the second element in the first group and the second element in the second group comprise a second element pair; and
   a controller configured to cause:
      the first element pair to be compared by controlling sensing circuitry to perform a number of operations without transferring data via an input/output (I/O) line; and
      the second element pair to be compared in parallel with the first element pair.

2. The apparatus of claim 1, wherein the number of operations comprises a number of AND operations, OR operations, INVERT operations, and SHIFT operations.

3. The apparatus of claim 1, wherein the sensing circuitry comprises a number of transistors formed on pitch with the memory cells.

4. The apparatus of claim 3, wherein the sensing circuitry comprises a sense amplifier and a compute component.

5. The apparatus of claim 4, wherein the sensing circuitry comprises a sense amplifier comprising a primary latch and a compute component comprising a secondary latch.

6. A method for comparing elements comprising:
   determining a respective bit length of each element of a plurality of first elements and a plurality of second elements;
   performing a plurality of comparison operations on:
      the plurality of first elements stored in a first group of memory cells coupled to a first access line and to a number of sense lines of a memory array; and
      the plurality of second elements stored in a second group of memory cells coupled to a second access line and to the number of sense lines of the memory array; and
      wherein corresponding element pairs being compared have a same bit length; and
      wherein at least one of the plurality of first elements comprises a bit length different than a bit length of at least one other of the plurality of first elements; and
   providing an indication of whether, in the comparison operation, a numerical value corresponding to a respective first element of the plurality of first elements is greater than a numerical value corresponding to a corresponding second element of the plurality of second elements;
   storing in a third group of memory cells results of the plurality of comparison operations performed on the first plurality of elements and the plurality of second elements, the third group of cells comprising:
      a number of memory cells coupled to a third access line and to the number of sense lines; and
      a number of memory cells coupled to a fourth access line and to the number of sense lines; and
   controlling, by a controller, sensing circuitry to perform the plurality of comparison operations and to store the results of the plurality of comparison operations in the third group of memory cells without transferring data via an input/output (I/O) line.

7. The method of claim 6, wherein providing the indication further comprises providing an indication of whether each respective one of the plurality of first elements is greater than a corresponding respective one of the plurality of second elements.

8. The method of claim 6, further comprising performing the plurality of comparison operations in parallel.

9. The method of claim 6, wherein a number of operations used to perform the plurality of comparison operations in parallel is the same as a number of operations used to perform any one of the plurality of comparison operations.

10. The apparatus of claim 6, wherein each of the plurality of comparison operations is performed on a different element pair including corresponding elements from the plurality of first elements and the plurality of second elements.

11. The apparatus of claim 10, wherein elements in each of the different element pairs comprise vectors having a same bit length.

12. An apparatus comprising:
a first group of memory cells coupled to a first access line and to a number of sense lines and configured to store a plurality of first elements;
a second group of memory cells coupled to a second access line and to the number of sense lines and configured to store a plurality of second elements;
a third group of memory cells configured to store results of a plurality of comparison operations performed on the first plurality of elements and the plurality of second elements, the third group of cells comprising:
a number of memory cells coupled to a third access line and to the number of sense lines; and
a number of memory cells coupled to a fourth access line and to the number of sense lines; and
a controller configured to control sensing circuitry to perform the plurality of comparison operations and store the results of the plurality of comparison operations in the third group of memory cells without transferring data via an input/output (I/O) line.

13. The apparatus of claim 12, wherein the controller is further configured to control the sensing circuitry to create a first destination bit-vector that identifies differences in the plurality of first elements as compared to the plurality of second elements.

14. The apparatus of claim 13, wherein the controller is further configured to control the sensing circuitry to create a second destination bit-vector that identifies differences in the plurality of second elements as compared to the plurality of first element.

15. The apparatus of claim 14, wherein the controller is further configured to control the sensing circuitry to replicate bits in the first destination bit-vector that identify differences in the plurality of first elements as compared to the plurality of second elements in a first replication phase.

16. The apparatus of claim 15, wherein the controller is further configured to control the sensing circuitry to replicate bits in the second destination bit-vector that identify differences in the plurality of second element as compared to the plurality of first elements in the first replication phase.

17. The apparatus of claim 16, wherein the controller is further configured to control the sensing circuitry to store in the first destination bit-vector differences in the first destination bit-vector as compared to the second destination bit-vector.

18. The apparatus of claim 17, wherein the controller is further configured to control the sensing circuitry to store in the second destination bit-vector differences in the second destination bit-vector as compared to the first destination bit-vector.

19. The apparatus of claim 18, wherein the controller is further configured to control the sensing circuitry to replicate bits in the first destination bit-vector in a second replication phase.

20. The apparatus of claim 19, wherein the controller is further configured to control the sensing circuitry to replicate bits in the second destination bit-vector in the second replication phase.

21. The apparatus of claim 20, wherein replicating bits in the first replication phase and the second replication phase includes performing a number of SHIFT operations.

22. The apparatus of claim 21, wherein the controller is further configured to control the sensing circuitry to store a static mask that defines a respective vector length for each of the plurality of first elements and for each of the plurality of second elements, and wherein the vector length of at least two of the plurality of first elements are different.

23. The apparatus of claim 22, wherein a quantity of the number of SHIFT operations performed is based on a particular vector length from the respective vector lengths of the plurality of first elements and the plurality of second elements.

24. The apparatus of claim 13, wherein the first destination bit-vector and the second destination bit-vector are the results of the plurality of comparison operations.

* * * * *